US011894622B2

(12) United States Patent
Hänninen et al.

(10) Patent No.: US 11,894,622 B2
(45) Date of Patent: Feb. 6, 2024

(54) ANTENNA STRUCTURE WITH DOUBLE-SLOTTED LOOP AND ASSOCIATED METHODS

(71) Applicant: Silicon Laboratories Inc., Austin, TX (US)

(72) Inventors: Tuomas Hänninen, Helsinki (FI); Pasi Rahikkala, Vihti (FI); Attila Zolomy, Budapest (HU)

(73) Assignee: Silicon Laboratories Inc., Austin, TX (US)

( * ) Notice: Subject to any disclaimer, the term of this patent is extended or adjusted under 35 U.S.C. 154(b) by 289 days.

(21) Appl. No.: 17/491,195

(22) Filed: Sep. 30, 2021

(65) Prior Publication Data

US 2022/0131271 A1  Apr. 28, 2022

Related U.S. Application Data

(63) Continuation-in-part of application No. 16/237,511, filed on Dec. 31, 2018, and a continuation-in-part of application No. 16/724,160, filed on Dec. 20, 2019, now Pat. No. 11,764,749, which is a continuation-in-part of application No. 16/237,583, filed on Dec. 31, 2018, now Pat. No. 11,769,949, which is a continuation-in-part of application No. 15/250,719, filed on Aug. 29, 2016, now Pat. No. 10,374,300.

(51) Int. Cl.
*H01Q 7/00* (2006.01)
*H03H 7/38* (2006.01)
*H01Q 1/38* (2006.01)

(52) U.S. Cl.
CPC .............. *H01Q 7/00* (2013.01); *H01Q 1/38* (2013.01); *H03H 7/38* (2013.01)

(58) Field of Classification Search
CPC .. H01Q 7/00; H01Q 1/24; H01Q 1/38; H03H 7/38
See application file for complete search history.

(56) References Cited

U.S. PATENT DOCUMENTS

| 4,328,501 A | 5/1982 | DeSantis |
| 4,799,066 A | 1/1989 | Deacon |
| 5,631,611 A | 5/1997 | Luu |

(Continued)

FOREIGN PATENT DOCUMENTS

| CN | 10650596 2 A | 3/2017 |
| EP | 2214306 | 8/2010 |
| KR | 20150072119 A | 6/2015 |

OTHER PUBLICATIONS

Office communication in U.S. Appl. No. 15/845,327, 6 pgs.
(Continued)

*Primary Examiner* — Hoang V Nguyen
(74) *Attorney, Agent, or Firm* — Law Offices of Maximilian R. Peterson

(57) ABSTRACT

An apparatus includes a module. The module includes an antenna structure. The antenna structure includes a printed monopole antenna. The antenna structure further includes first and second inductive-capacitive (LC) resonant networks that are coupled to the printed monopole antenna. The antenna structure further includes a double slotted loop coupled to the first and second LC resonant networks.

20 Claims, 36 Drawing Sheets

(56) References Cited

U.S. PATENT DOCUMENTS

| | | |
|---|---|---|
| 5,874,926 A | 2/1999 | Tsuru |
| 5,889,445 A | 3/1999 | Ritter |
| 5,949,299 A | 9/1999 | Harada |
| 5,995,814 A | 11/1999 | Yeh |
| 6,009,318 A | 12/1999 | Freed |
| 6,329,886 B1 | 12/2001 | Ogoro |
| 6,603,430 B1 | 8/2003 | Hill |
| 6,862,441 B2 | 3/2005 | Ella |
| 6,980,776 B2 | 12/2005 | Shimada |
| 6,990,357 B2 | 1/2006 | Ella |
| 7,034,630 B2 | 4/2006 | Rijks |
| 7,058,372 B1 | 6/2006 | Pardoen |
| 7,088,307 B2 * | 8/2006 | Imaizumi ............... H03H 7/38 343/862 |
| 7,116,185 B2 | 10/2006 | Ohi |
| 7,155,252 B2 | 12/2006 | Martin |
| 7,193,477 B2 | 3/2007 | Chang et al. |
| 7,199,684 B2 | 4/2007 | Aigner |
| 7,248,844 B2 | 7/2007 | Rofougaran |
| 7,323,939 B2 | 1/2008 | Han et al. |
| 7,330,085 B2 | 2/2008 | Ezzeddine |
| 7,466,277 B2 | 12/2008 | Ishizuka |
| 7,489,914 B2 | 2/2009 | Govind |
| 7,518,469 B2 | 4/2009 | Kemmochi |
| 7,557,757 B2 | 7/2009 | Deavours |
| 7,586,388 B2 | 9/2009 | Harada |
| 7,683,733 B2 | 3/2010 | Li |
| 7,755,435 B2 | 7/2010 | Lu et al. |
| 7,978,024 B2 | 7/2011 | Cheng |
| 8,068,795 B2 | 11/2011 | Bavisi |
| 8,081,047 B2 | 12/2011 | Royak |
| 8,138,853 B2 | 3/2012 | Chu |
| 8,164,387 B1 | 4/2012 | Apel |
| 8,174,390 B2 | 5/2012 | Kim |
| 8,229,367 B2 | 7/2012 | Chan et al. |
| 8,306,489 B2 | 11/2012 | Schwarzmueller |
| 8,344,952 B2 | 1/2013 | Yi |
| 8,368,481 B2 | 2/2013 | Jin |
| 8,436,695 B2 | 5/2013 | Mu |
| 8,493,126 B2 | 7/2013 | Sankaranarayana |
| 8,633,781 B2 | 1/2014 | Bradley |
| 8,842,410 B2 | 9/2014 | Chan |
| 9,059,681 B2 | 6/2015 | Tanaka |
| 9,083,301 B2 | 7/2015 | Tanaka |
| 9,106,204 B2 | 8/2015 | Fritz |
| 9,306,535 B2 | 4/2016 | Bradley |
| 9,316,723 B2 | 4/2016 | Tayrani |
| 9,397,720 B2 | 7/2016 | Jerng |
| 9,520,854 B2 | 12/2016 | Kim |
| 9,647,706 B2 | 5/2017 | Salfelner |
| 9,680,442 B2 | 6/2017 | Salfelner |
| 9,917,566 B2 | 3/2018 | Salfelner |
| 9,939,471 B1 | 4/2018 | Omoumi |
| 9,991,597 B2 | 6/2018 | Velandia |
| 10,071,605 B1 | 9/2018 | Liang |
| 10,305,532 B1 | 5/2019 | Jantzi |
| 10,374,300 B2 | 8/2019 | Rahikkala |
| 2002/0118075 A1 | 8/2002 | Ohwada |
| 2003/0012808 A1 | 7/2003 | Ella |
| 2003/0174093 A1 | 9/2003 | Huber |
| 2003/0210189 A1 | 11/2003 | Jinushi |
| 2005/0003771 A1 | 1/2005 | De Ruijter |
| 2005/0174297 A1 | 8/2005 | Cake |
| 2005/0208917 A1 | 9/2005 | Roufoogaran |
| 2006/0044080 A1 | 3/2006 | Hagiwara |
| 2006/0092079 A1 | 5/2006 | de Rochemont |
| 2006/0103578 A1 | 5/2006 | Landaeus |
| 2007/0001704 A1 | 1/2007 | O'Mahony |
| 2007/0024377 A1 | 2/2007 | Wang et al. |
| 2007/0268092 A1 | 11/2007 | Inoue |
| 2008/0129610 A1 | 6/2008 | Tsafati et al. |
| 2008/0174383 A1 | 7/2008 | Zolomy et al. |
| 2008/0186106 A1 | 8/2008 | Christian |
| 2008/0278258 A1 | 11/2008 | Liu |
| 2009/0015500 A1 | 1/2009 | Hoshiai |
| 2009/0085689 A1 | 4/2009 | Rohani |
| 2009/0121959 A1 | 5/2009 | Li |
| 2009/0130999 A1 | 5/2009 | Chen |
| 2009/0174618 A1 | 7/2009 | Huang |
| 2009/0251382 A1 | 10/2009 | Umehara |
| 2009/0315792 A1 | 12/2009 | Miyashita |
| 2009/0322617 A1 | 12/2009 | Tseng |
| 2010/0073248 A1 | 3/2010 | Motta |
| 2010/0109846 A1 | 5/2010 | Nagai |
| 2010/0231451 A1 | 9/2010 | Noguchi |
| 2010/0238079 A1 | 9/2010 | Ayatollahi |
| 2010/0253581 A1 | 10/2010 | Tsou |
| 2010/0265145 A1 | 10/2010 | Chung |
| 2010/0289700 A1 | 11/2010 | Yang |
| 2011/0223873 A1 | 9/2011 | Qiu |
| 2011/0256841 A1 | 10/2011 | Kakuya |
| 2012/0001821 A1 | 1/2012 | Nakano |
| 2012/0112972 A1 | 5/2012 | Ogawa |
| 2012/0154071 A1 | 6/2012 | Bradley |
| 2012/0229360 A1 | 9/2012 | Jagielski |
| 2012/0314734 A1 | 12/2012 | Zierdt |
| 2013/0033410 A1 | 2/2013 | Wong |
| 2013/0214812 A1 | 8/2013 | Koo |
| 2013/0307742 A1 | 11/2013 | Hu |
| 2013/0314288 A1 | 11/2013 | Tayrani |
| 2013/0334215 A1 | 12/2013 | Chen |
| 2013/0341411 A1 | 12/2013 | Kai |
| 2013/0342421 A1 | 12/2013 | Katz |
| 2014/0111381 A1 | 4/2014 | Lee |
| 2014/0111382 A1 | 4/2014 | Lee |
| 2014/0113679 A1 | 4/2014 | Wehrmann |
| 2014/0125540 A1 | 5/2014 | Tetsuno |
| 2014/0125548 A1 | 5/2014 | Jouanlanne |
| 2014/0125552 A1 | 5/2014 | Takisawa |
| 2014/0320351 A1 | 10/2014 | Wei |
| 2014/0327494 A1 | 11/2014 | Sato |
| 2014/0375507 A1 | 12/2014 | Lin |
| 2014/0375527 A1 | 12/2014 | Rutfors |
| 2015/0022402 A1 | 1/2015 | Gavilan |
| 2015/0048896 A1 | 2/2015 | Kovac |
| 2015/0311881 A1 | 10/2015 | Nagumo |
| 2015/0349726 A1 | 12/2015 | Han et al. |
| 2016/0156335 A1 | 6/2016 | Takeuchi |
| 2016/0164474 A1 | 6/2016 | Beltran |
| 2016/0268992 A1 | 9/2016 | Salfelner |
| 2016/0336649 A1 | 11/2016 | Yu |
| 2017/0054214 A1 | 2/2017 | Sanders |
| 2017/0214378 A1 | 7/2017 | Black |
| 2017/0244442 A1 | 8/2017 | Mizokami |
| 2018/0062254 A1 | 3/2018 | Rahikkala |
| 2018/0123221 A1 | 5/2018 | Finn |
| 2018/0145410 A1 | 5/2018 | Ban |
| 2018/0316082 A1 | 11/2018 | Keller |
| 2019/0190149 A1 | 6/2019 | Vida |
| 2019/0280383 A1 | 9/2019 | Zolomy |
| 2020/0127628 A1 | 4/2020 | Zolomy |

OTHER PUBLICATIONS

Office communication in U.S. Appl. No. 15/845,369, 10 pgs.
Office communication in U.S. Appl. No. 16/237,511, 31 pgs.
Office communication in U.S. Appl. No. 17/705,260, 7 pgs.
U.S. Appl. No. 15/250,719, filed Aug. 2016, Rahikkala.
U.S. Appl. No. 16/439,458, filed Jun. 2019, Rahikkala.
U.S. Appl. No. 15/823,319, filed Nov. 2017, Zólomy.
U.S. Appl. No. 15/845,327, filed Dec. 2017, Vida.
U.S. Appl. No. 15/845,369, filed Dec. 2017, Vida.
U.S. Appl. No. 16/237,511, filed Dec. 2018, Zólomy.
U.S. Appl. No. 16/237,583, filed Dec. 2018, Zólomy.
U.S. Appl. No. 16/420,111, filed May 2019, Voor.
U.S. Appl. No. 16/420,116, filed Feb. 2019, Zólomy.
U.S. Appl. No. 16/719,925, filed Dec. 2019, Vida.
U.S. Appl. No. 16/724,160, filed Dec. 2019, Zólomy.
U.S. Appl. No. 17/491,221, filed Sep. 2021, Rahikkala.
Johanson Technology, *High Frequency Ceramic Solutions*, 4 pgs., 2016.
Johanson Technology, *High Frequency Ceramic Solutions*, 4 pgs., 2014.

(56) References Cited

OTHER PUBLICATIONS

AN91445, *Antenna Design and RF Layout Guidelines*, Cypress, 60 pgs., 2014-2016.
Amotech Co., Ltd., *Datasheet*, 8 pgs., 2009.
Office communcation in U.S. Appl. No. 15/250,719, 9 pgs.
Office communcation in U.S. Appl. No. 15/250,719, 8 pgs.
Office communcation in U.S. Appl. No. 15/823,319, 18 pgs.
Office communcation in U.S. Appl. No. 15/823,319, 29 pgs.
Office communcation in U.S. Appl. No. 15/823,319, 32 pgs.
Office communcation in U.S. Appl. No. 15/823,319, 16 pgs.
AN923: EFR32 sub-GHz Matching Guide, Silicon Labs, Jun. 29, 2016, 25 pgs.
D.C. Youla, A New Theory of Broad-band Matching, Iee Transactions on Circuit Theory, Mar. 1964, 21 pgs.
Károly Geller: Linear Networks, 4th edition 1979, Hungarian Technical Book Press (pp. 434-436; translated portions included).
AN643: Si446x/Si4362 RX LNA Matching, Silicon Labs, 2014, 26 pgs.
Office communication in U.S. Appl. No. 15/845,327, 12 pgs.
Office communication in U.S. Appl. No. 15/845,327, 18 pgs.
Office communication in U.S. Appl. No. 15/845,327, 15 pgs.
Office communication in U.S. Appl. No. 15/845,327, 14 pgs.
Web page, "3.1 Multi-band Sub-1GHz tunable RF sub-system for smart meters" (Apr. 27, 2017, 2 pgs.), available at https://training.ti.com/multi-band-sub-lghz-tunable-rf-sub-system-smart-meters.
Office communication in U.S. Appl. No. 16/237,511, 10 pgs.
Office communication in U.S. Appl. No. 16/237,511, 14 pgs.
Office communication in U.S. Appl. No. 16/237,583, 10 pgs.
Office communication in U.S. Appl. No. 16/237,583, 8 pgs.
Office communication in U.S. Appl. No. 16/237,583, 9 pgs.
Office communication in U.S. Appl. No. 16/420,111, 9 pgs.
Office communication in U.S. Appl. No. 16/420,111, 10 pgs.
Office communication in U.S. Appl. No. 16/420,116, 9 pgs.
Office communication in U.S. Appl. No. 16/420,116, 7 pgs.
Office communication in U.S. Appl. No. 16/719,925, 13 pgs.
Office communication in U.S. Appl. No. 16/719,925, 19 pgs.
Office communication in U.S. Appl. No. 16/719,925, 17 pgs.
Office communication in U.S. Appl. No. 16/724,160, 8 pgs.
AN427: EZ Radio Protm Si433X & Si443X RX LNA Matching, Silicon Labs, 2009, 22 pgs.
Liu et al., Excitation Techniques of Loop Current Mode of Ground Antenna, 2011 Cross Strait Quad Regional Radio Science and Wireless Technology Conference, 2011, 4 pgs.
Zahid et al., Analysis of a loop type ground radiation antenna based on equivalent circuit model, IET Microwave, Antennas & Propagation Journal, 2016, 6 pgs.
Cho et al., Loop-type ground antenna using capacitor, Electronics Letters, Jan. 6, 2011, vol. 47, No. 1, 1 pg.
Zhang et al., Bandwidth enhancement of ground antenna using resonant feeding circuit, Electronics Letters, Mar. 28, 2013, vol. 49, No. 7, 2 pgs.
Qu et al., Circular Polarized Ground Radiation Antenna for Mobile Applications, IEEE Transactions on Antennas and Propagation, vol. 66, No. 5, May 2018, pp. 2655-2660.
Zahid et al., Decoupler Deign for Mimo Antennas of USB Dongle Applications Using Ground Mode Coupling Analysis, Progress in Electromagnetics Research M, vol. 76, 113-122, 2018, 10 pgs.
Liu et al., Loop-Type Ground Radiation Antenna for Dual-Band Wlan Applications, IEEE Transactions on Antennas and Propagation, vol. 61, No. 9, Sep. 2013, pp. 4819-4823.
Qu et al., Compact dual-band antenna using inverted-L loop and inner rectangular loop for WLAN applications, Electronics Letters, Nov. 5, 2015, vol. 51, No. 23, pp. 1843-1844.
Liu et al., Excitation Techniques of Loop Current Mode of Ground Antenna, 2011 Cross Strait Quad-Regional Radio Science and Wireless Technology Conference, 2011, pp. 1732-1735.
Qu et al., Performance enhancement of ground radiation antenna for Z-wave applications using tunable metal loads, Electronics Letters, 27th Oct. 2016, vol. 52, No. 22, pgs. 1827-1828.
Shin et al., Ground unknown, but before Radiation Antenna using Magnetic Coupling Structure, IEEE (date filing of the instant application), 3 pgs.
Qu et al., Ground Radiation Antenna for Mobile Devices, IEEE, 2017, 3 pgs.
Xu et al., Improvement of ground radiation antenna performance using compact EBG in presence of battery effects, Electronics Letters, Jun. 28, 2018, vol. 54, No. 13, pp. 789-800.
Qu et al., Decoupling between ground radiation antennas with ground-coupled loop-type isolator for WLAN applications, IET Microwaves, Antennas & Propagation, 2018, pp. 546-552.
Liu et al., Loop-type ground antenna using resonated loop feeding, intended for mobile devices, Electronics Letters, Mar. 31, 2011, vol. 47, No. 7, 2 pgs.
Piao et al., MIMO Ground-Radiation Antennas Using a Novel Closed-Decoupling-Loop for 5G Applications, IEEE 2020, pp. 142714-142724.
Kim et al., Miniaturized dual-band loop-type ground radiation antenna with enhanced bandwidth for mobile devices, Microw Opt Technol Lett., 2019, pp. 239-243.
Zahid et al., Performance evaluation of loop-type ground radiation antenna based on its optimum impedance level, Electronics Letters, Mar. 30, 2017, vol. 53, No. 7, pp. 446-448.
Hassan et al., A wideband loop-type ground radiation antenna using ground mode tuning and optimum impedance level, Microw Opt Technol Lett., 2019, pp. 1-6.
Johanson Technology, High Frequency Ceramic Solutions, 5 pgs., Oct. 12, 2020.
Office communication in U.S. Appl. No. 15/845,369, 17 pgs.
Office communication in U.S. Appl. No. 15/845,369, 15 pgs.
Office communication in U.S. Appl. No. 15/845,369, 12 pgs.
Office communication in U.S. Appl. No. 16/237,511, 15 pgs.
Office communication in U.S. Appl. No. 16/719,925, 15 pgs.
Office communication in U.S. Appl. No. 16/724,160, 28 pgs.
Office communication in U.S. Appl. No. 15/823,319, 16 pgs.
Search report in CN application 201911132444X, 2 pgs.
Office communication in U.S. Appl. No. 15/845,327, 3 pgs.
Office communication in U.S. Appl. No. 16/237,511, 22 pgs.
Office communication in U.S. Appl. No. 16/719,925, 18 pgs.
Office communication in U.S. Appl. No. 16/719,925, 22 pgs.
Office communication in U.S. Appl. No. 17/705,260, 9 pgs.
Office communication in U.S. Appl. No. 16/719,925, 28 pgs.

* cited by examiner

ANTENNA STRUCTURE WITH DOUBLE-SLOTTED LOOP AND ASSOCIATED METHODS

CROSS-REFERENCE TO RELATED APPLICATIONS

This patent application is a continuation-in-part of U.S. patent application Ser. No. 16/724,160, filed on Dec. 20, 2019, titled "Apparatus with Partitioned Radio Frequency Antenna and Matching Network and Associated Methods", which is a continuation-in-part of U.S. patent application Ser. No. 16/237,583, filed on Dec. 31, 2018, titled "Apparatus with Partitioned Radio Frequency Antenna and Matching Network and Associated Methods,", which is a continuation-in-part of U.S. patent application Ser. No. 15/250,719, filed on Aug. 29, 2016, titled "Apparatus with Partitioned Radio Frequency Antenna Structure and Associated Methods,". Furthermore, the present patent application is a continuation-in-part of U.S. patent application Ser. No. 16/237,511, filed on Dec. 31, 2018, titled "Apparatus for Antenna Impedance-Matching and Associated Methods,". The foregoing patent applications are hereby incorporated by reference in their entireties for all purposes.

TECHNICAL FIELD

The disclosure relates generally to radio frequency (RF) signal transmission/reception techniques, circuitry, systems, and associated methods. More particularly, the disclosure relates to RF apparatus with antennas or antenna structures to provide improved features, and associated methods.

BACKGROUND

With the increasing proliferation of wireless technology, such as Wi-Fi, Bluetooth, and mobile or wireless Internet of things (IoT) devices, more devices or systems incorporate radio frequency (RF) circuitry, such as receivers and/or transmitters. To reduce the cost, size, and bill of materials, and to increase the reliability of such devices or systems, various circuits or functions have been integrated into integrated circuits (ICs). For example, ICs typically include receiver and/or transmitter circuitry. A variety of types and circuitry for transmitters and receivers are used. Transmitters send or transmit information via a medium, such as air, using RF signals. Receivers at another point or location receive the RF signals from the medium, and retrieve the information.

To transmit or receive RF signals, typical wireless devices or apparatus use antennas. RF modules are sometimes used that include the transmit/receive circuitry. A typical RF module 5, shown in FIG. 1, includes an RF circuit 6, a resonator 8, and a radiator 9. Typically, resonator 8 and radiator 9 are included in the RF module. In other words, the structures that form resonator 8 and radiator 9 are included within RF module 5.

The description in this section and any corresponding figure(s) are included as background information materials. The materials in this section should not be considered as an admission that such materials constitute prior art to the present patent application.

SUMMARY

A variety of apparatus and associated methods are contemplated according to exemplary embodiments. According to one exemplary embodiment, an apparatus includes a module. The module includes an antenna structure. The antenna structure includes a printed monopole antenna. The antenna structure further includes first and second inductive-capacitive (LC) resonant networks that are coupled to the printed monopole antenna. The antenna structure further includes a double slotted loop coupled to the first and second LC resonant networks.

According to another exemplary embodiment, an apparatus includes a module. The module includes an antenna structure. The antenna structure includes a monopole antenna that includes a printed trace in the module. The antenna structure includes a first LC resonant network that is coupled to the monopole antenna, and includes a first inductor coupled to a first plurality capacitors. The antenna structure includes a second LC resonant network that is coupled to the monopole antenna, and includes a second inductor coupled to a second plurality capacitors. The antenna structure also includes a double slotted printed loop that is coupled to the first and second LC resonant networks.

According to another exemplary embodiment, a method of providing an antenna structure in an RF module includes fabricating a monopole antenna by using a printed trace of the RF module. The method further includes fabricating first and second LC resonant networks. The first and second LC resonant networks are coupled to the monopole antenna. The method further includes fabricating a double slotted loop. The double slotted loop is coupled to the first and second LC resonant networks.

BRIEF DESCRIPTION OF THE DRAWINGS

The appended drawings illustrate only exemplary embodiments and therefore should not be considered as limiting the scope of the application or the claims. Persons of ordinary skill in the art will appreciate that the disclosed concepts lend themselves to other equally effective embodiments. In the drawings, the same numeral designators used in more than one drawing denote the same, similar, or equivalent functionality, components, or blocks.

DETAILED DESCRIPTION

One aspect of the disclosure relates generally to RF apparatus with partitioned antenna structures to provide improved features, and associated methods. As described below, according to this aspect, in RF apparatus according to exemplary embodiments, the antenna structures are partitioned. More specifically, part of the resonator and radiator structures are included in one device (e.g., a module), and the remaining or additional part(s) of the resonator and radiator structures are made or fabricated or included outside the device (e.g., externally to a module).

Figure 1:
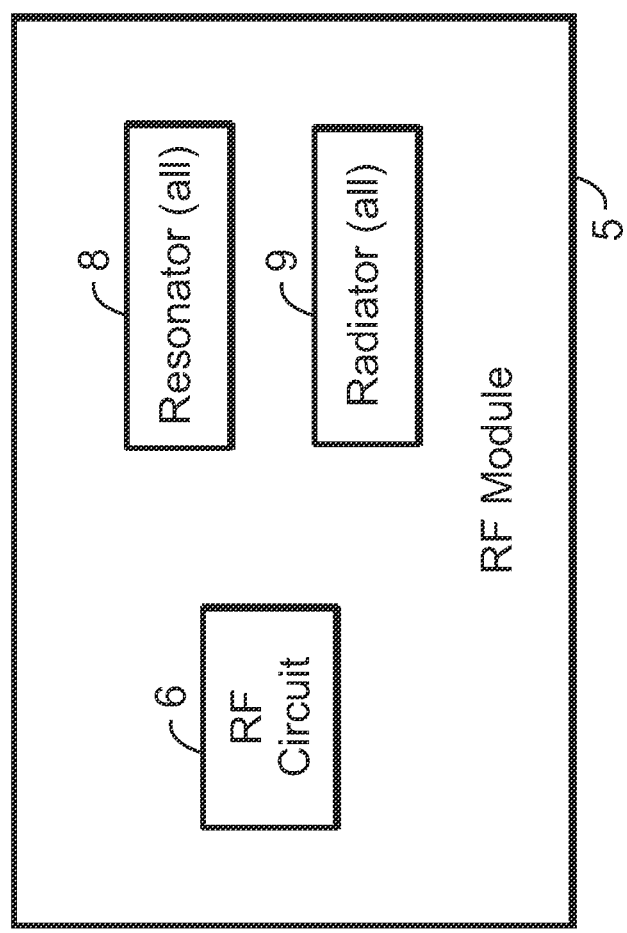
FIG. 1 shows a conventional RF module.
Figure 2:
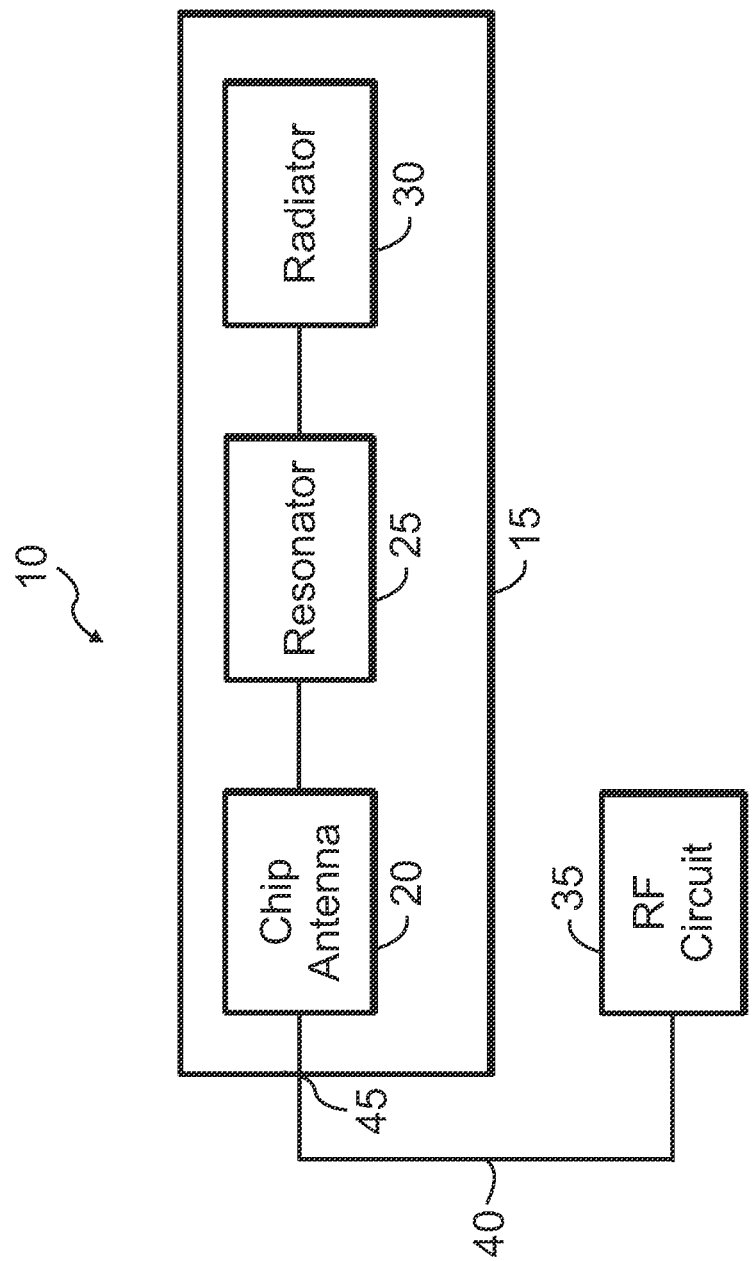
FIG. 2 shows a circuit arrangement for an RF apparatus (or part of an RF apparatus) according to an exemplary embodiment.

FIG. 2 depicts a circuit arrangement 10 for an RF apparatus (or part of an RF apparatus) according to an exemplary embodiment. More specifically, circuit arrangement 10 illustrates the electrical connections or couplings among the various parts of an RF apparatus.

Circuit arrangement 10 includes antenna structure 15. Antenna structure 15 includes chip antenna 20 coupled to resonator 25. Generally, resonator 25 includes devices, components, or apparatus that naturally oscillate at some frequency, e.g., the frequency at which the RF apparatus transmits RF signals or the frequency at which the RF apparatus receives RF signals. In exemplary embodiments, the reactance of one or more features or devices or portion of the substrate (on which various components of circuit arrangement 10 are arranged or fixated) or the substrate layout, matching components (e.g., inductor(s), capacitor(s)) (not shown), and/or chip antenna 20 form resonator 25.

Referring again to FIG. 2, resonator 25 is coupled to radiator 30. Generally, radiator 30 includes devices, components, or apparatus that transforms conducted RF energy (e.g., as received from RF circuit 35 or from a communication medium, such as air or free space) into radiated RF energy. In exemplary embodiments, one or more features or devices or portions of the substrate (on which various components of circuit arrangement 10 are arranged or fixated) or the substrate layout, chip antenna 20, and/or surrounding ground plane (e.g., ground plane formed in or on a substrate on which the substrate include circuit arrangement 10 is arranged or fixated) form radiator 30.

Referring again to FIG. 2, RF circuit 35 couples to antenna structure 15 via link 40. In exemplary embodiments, RF circuit 35 may include transmit (TX), receive (RX), or both transmit and receive (transceiver) circuitry. In the transmit mode, RF circuit 35 uses antenna structure 15 to transmit RF signals. In the receive mode, RF circuit 35 receives RF signals via antenna structure 15. In the transceiver mode, RF circuit 35 can receive RF signals during some periods of time and alternately transmit RF signals during other periods of time (or perform neither transmission nor reception, if desired). Thus, the transceiver mode may be thought of as combining the transmit and receive modes in a time-multiplexed fashion.

Link 40 provides an electrical coupling to provide RF signals from RF circuit 35 to antenna structure 15 or, alternatively, provide RF signals from antenna structure 15 to RF circuit 35 (during the transmit and receive modes, respectively). Generally, link 40 constitutes a transmission line. In exemplary embodiments, link 40 may have or include a variety of forms, devices, or structures. For example, in some embodiments, link 40 may include a coaxial line or structures. As another example, in some embodiments, link 40 may include a stripline or microstrip structure (e.g., two conductors arranged in a length-wise parallel fashion).

Regardless of the form of link 40, link 40 couples to antenna structure 15 at feed point or node 45. In some embodiments, feed point 45 may include a connector, such as an RF connector. In some embodiments, feed point 40 may include electrical couplings (e.g., points, nodes, solder joints, etc.) to couple link 40 to chip antenna 20. Feed point 45 provides RF signals to chip antenna 20 (during the transmit mode) or alternately provides RF signals from chip antenna 20 to link 40 (during the receive mode).

In exemplary embodiments, chip antenna 20 may constitute a variety of desired chip antennas. Chip antennas are passive electronic components with relatively small physical dimensions, as persons of ordinary skill in the art know. Referring to FIG. 2, chip antenna 20, together with resonator 25 and radiator 30, forms antenna structure 15. As noted above, antenna structure 15 transmits RF signals from RF circuit 35 or provides RF signals received from a communication medium (e.g., air) to RF circuit 35. In some embodiments, antennas other than chip antennas may be used. The embodiment shown in FIG. 2 uses chip antenna 20 because of its relatively small size, relatively low cost, and relative ease of availability.

Generally, in exemplary embodiments, structures used to fabricate or implement resonator 25 and radiator 30 might overlap or have common elements. For example, as noted above, in some embodiments, resonator 25 and radiator 30 may include one or more features or devices of the substrate (on which various components of circuit arrangement or RF apparatus are arranged or fixated) or the substrate layout. In such situations, resonator 25 and radiator 30 may be combined.

Figure 3:
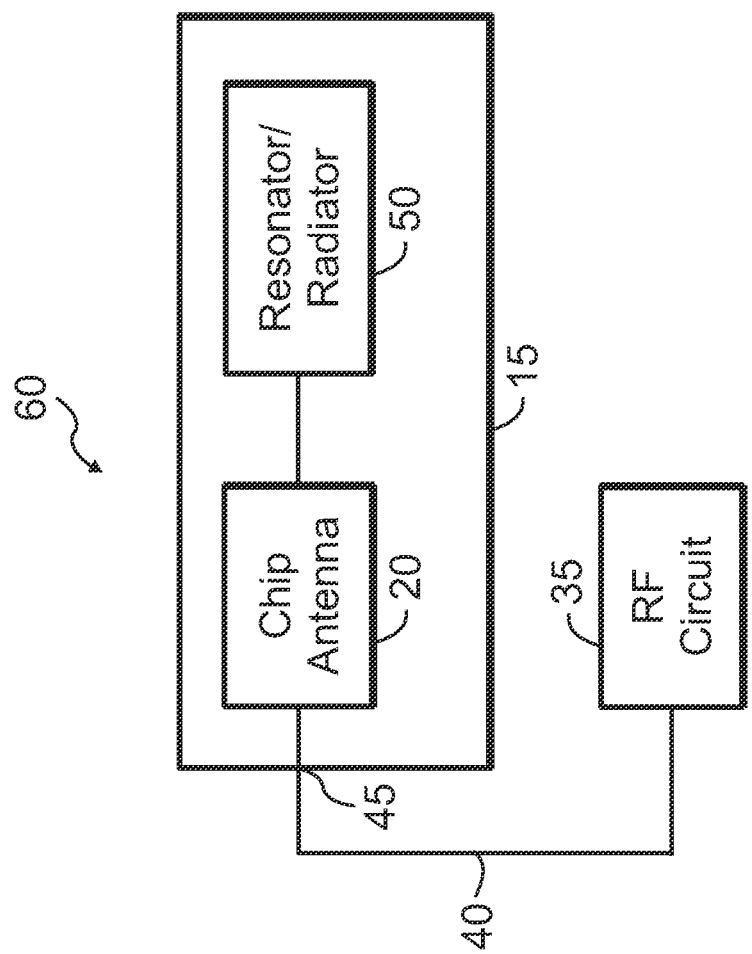
FIG. 3 shows a circuit arrangement for an RF apparatus (or part of an RF apparatus) according to another exemplary embodiment.

FIG. 3 shows a circuit arrangement 60 for an RF apparatus (or part of an RF apparatus) according to an exemplary embodiment that includes a combined resonator and radiator, i.e., resonator/radiator 50. More specifically, circuit arrangement 60 illustrates the electrical connections or couplings among the various parts of an RF apparatus. Other than the combined resonator and radiator, circuit arrangement 60 has the same or similar features as described above with respect to circuit arrangement 10 (see FIG. 2).

Figure 4:
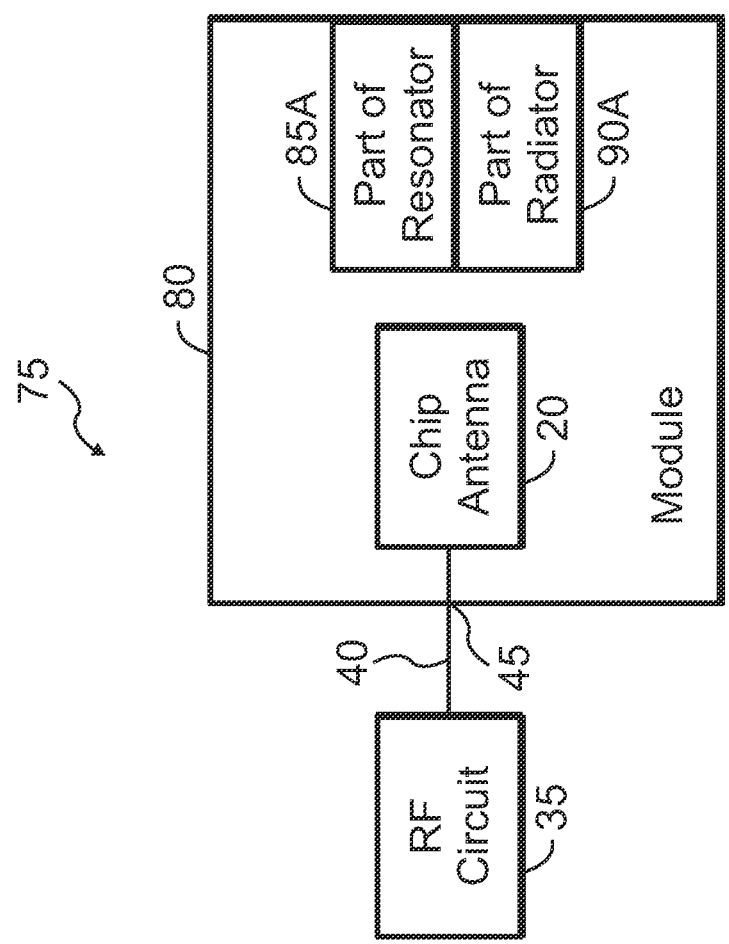
FIG. 4 shows an RF apparatus with a partitioned antenna structure according to an exemplary embodiment.
Figure 5:
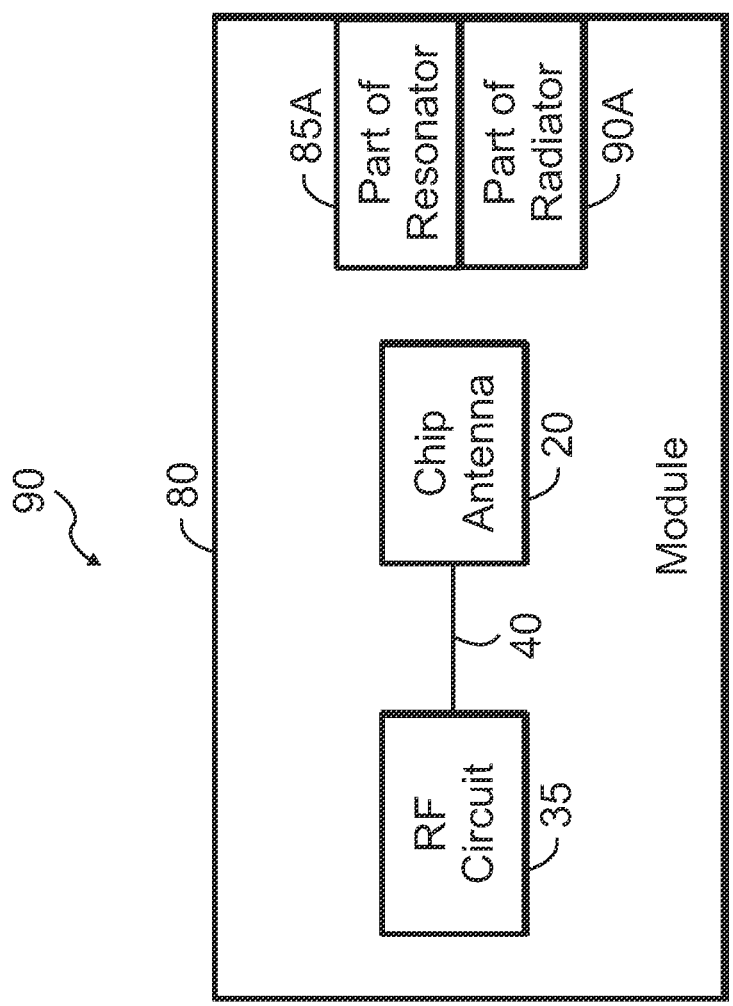
FIG. 5 shows an RF apparatus with a partitioned antenna structure according to another exemplary embodiment.
Figure 6:
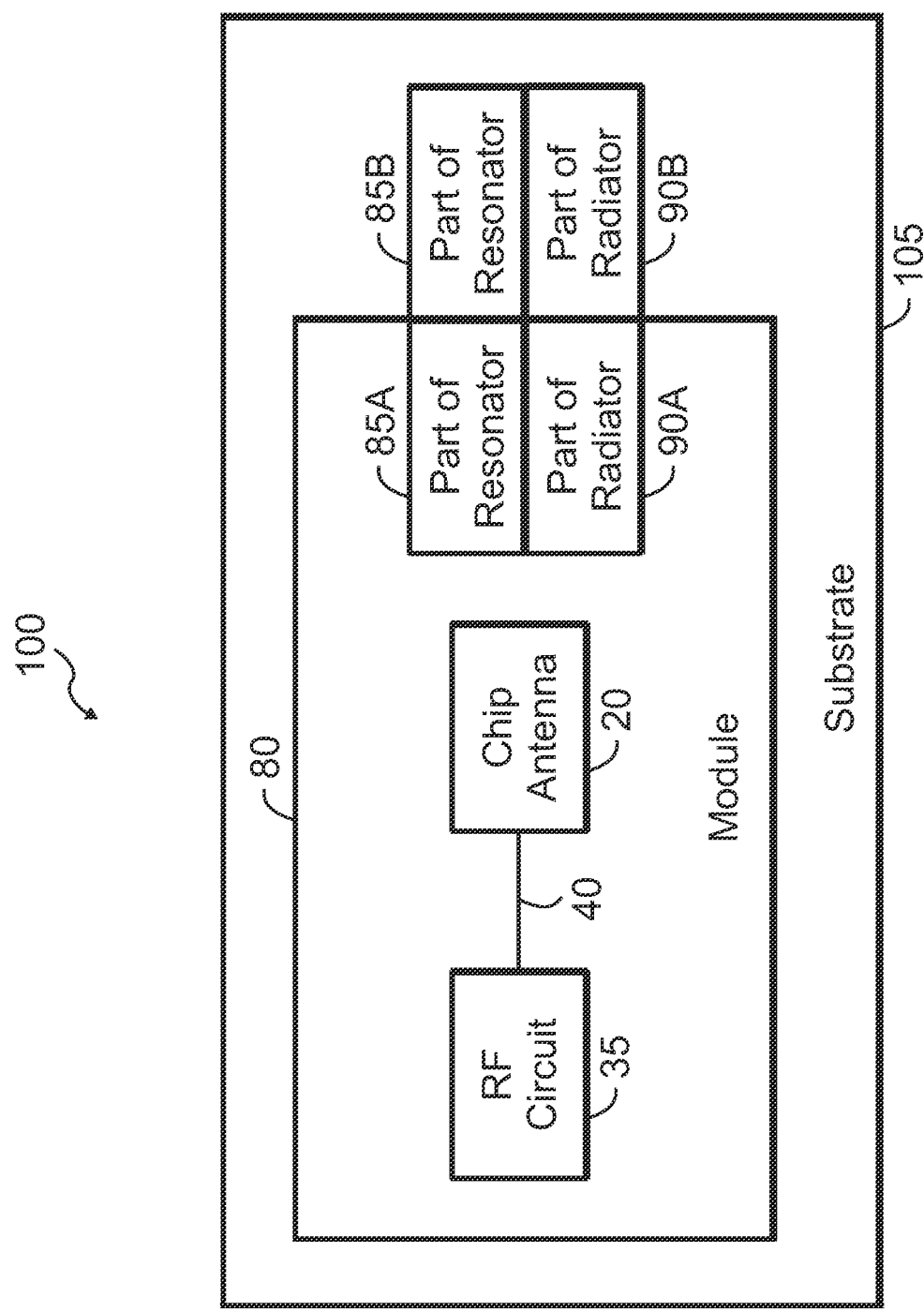
FIG. 6 shows an RF apparatus with a partitioned antenna structure according to another exemplary embodiment.

As noted, FIG. 2 and FIG. 3 show the electrical topology of an RF apparatus according to an exemplary embodiments. FIG. 4, FIG. 5, and FIG. 6 illustrate or add physical features or configuration of RF apparatus according to an exemplary embodiments. More specifically, FIG. 4, FIG. 5, and FIG. 6 show the partitioning of resonator 25 and radiator 30 (similar partitioning may be applied to a combined resonator and radiator, such as resonator/radiator 50 (see FIG. 3).

In exemplary embodiments, a physical carrier, device, enclosure, or other physical entity is used to house or include or support antenna structure 15. In some embodiments, antenna structure 15 (chip antenna 20, resonator 25, and radiator 30 in the embodiment of FIG. 2, or chip antenna 20 and resonator/radiator 50 in the embodiment shown in FIG. 3) are included or housed in a module. FIG. 4 shows such a module, labeled as 80.

In some embodiments, module 80 includes a physical device or component, such as a substrate (not shown) to which various components (e.g., chip antenna 20) are affixed or which supports various components. In exemplary embodiments, the substrate provides physical support for the various components of module 80. In addition, in some embodiments, the substrate provides a mechanism for electrically coupling various components of module 80. For example, the substrate may include electrically conducting traces to couple chip antenna 20 to the resonator and/or radiator.

In exemplary embodiments, the substrate may be fabricated in a variety of ways, as desired. For example, in some embodiments, the substrate may constitute a printed circuit board (PCB). The PCB, as persons of ordinary skill in the art will understand, provides mechanisms or features such as traces, vias, etc., to electrically couple various components of module 80. The PCB mechanisms or features may also be used to implement part of the resonator and/or radiator (or the combined resonator/radiator), for example, traces, matching components, ground planes, etc.

In exemplary embodiments, the material (or materials) used to fabricate the PCB may be selected based on a variety of considerations and attributes. For example, the PCB material may be selected so as to provide certain physical attributes, such as sufficient strength to support the various components in module 80. As another example, the PCB material may be selected so as to provide certain electrical attributes, such as dielectric constant to provide desired electrical characteristics, e.g., reactance at a given or desired frequency.

As noted, exemplary embodiments include a partitioned antenna structure. Referring again to FIG. 4, antenna structure 15 (not labeled in FIG. 4) includes a partitioned resonator and a partitioned radiator. More specifically, antenna structure 15 includes a part of a resonator in module 80. Thus, the resonator is physically partitioned into two portions (or parts or pieces). One of those portions is included in module 80, and is labeled 85A. In other words, portion 85A is less than the entire (or complete) resonator. Resonator part or portion 85A may include a part of the overall resonator structure, for instance, one more matching components, part of an overall ground plane, etc. The second part of the resonator is not included in module 80, and is fabricated using structures external to module 80, as described below in detail. The two portions of the resonator together form the entire or complete resonator.

Similarly, antenna structure 15 (not labeled in FIG. 4) includes a part of a radiator in module 80. In other words, the radiator is physically partitioned into two portions (or parts or pieces). One of those portions is included in module 80, and is labeled 90A in FIG. 4. Thus, portion 90A is less than the entire (or complete) radiator. Radiator part or portion 90A may include a part of the overall radiator structure, for instance, one more matching components, part of an overall ground plane, etc. The second part of the radiator is not included in module 80, and is fabricated using structures external to module 80, as described below in detail. The two portions of the radiator together form the entire or complete radiator.

Note that in some embodiments the resonator or the radiator is partitioned, but not both the resonator or radiator. For example, in some embodiments, the resonator is partitioned as described above, but the radiator is not partitioned and is included in module 80 (even though in this case the radiator may have relatively small efficiency). As another example, in some embodiments, the radiator is partitioned as described above, but the resonator is not partitioned and is included in module 80.

As noted above, in some embodiments, the resonator and the radiator are combined (e.g., a resonator/radiator). In such embodiments, antenna structure 15 (not labeled in FIG. 4) includes a part of the resonator/radiator in module 80. In other words, the resonator/radiator is physically partitioned into two portions (or parts or pieces). One of those portions is included in module 80. The resonator/radiator portion included in module 80 may include a part of the overall resonator/radiator structure, for instance, one more matching components, part of an overall ground plane, etc. The second part of the resonator/radiator is not included in module 80, and is fabricated using structures external to module 80.

Note that in the embodiment shown in FIG. 4, RF circuit 35 is not physically included in module 80. Instead, RF circuit 35 is external to module 80, and is coupled to chip antenna 20 via link 40. In some embodiments, RF circuit 35 is physically included in module 80, as is link 40. FIG. 5 depicts an example of such an embodiment. In the embodiment in FIG. 5, RF circuit is included in module 80, and is coupled to chip antenna 20 via link 40 (which is also included in module 80). Link 40 may be used externally to module 80 to allow communication with RF circuit 35 (e.g., providing signals to be transmitted or receiving RF signals that have been received). Including RF circuit 35 in module 80 facilitates certification of module 80 for a given standards or protocol, as desired.

As noted, antenna structure 15 includes portion of resonator 85A and portion of radiator 90A. The remaining portions or parts of the resonator and radiator are fabricated externally to module 80. In some embodiments, the remaining portions are fabricated using features or devices in a substrate to which module 80 is coupled or affixed. FIG. 6 depicts an example of such an embodiment.

More specifically, apparatus 100 in FIG. 6 shows an RF module 80 that is coupled to or affixed to substrate 105. In addition to module 80, substrate 105 may be coupled to or affixed to other devices, features, subsystems, circuits, etc., as desired. In exemplary embodiments, substrate 105 may be fabricated in a variety of ways, as desired. For example, in some embodiments, the substrate may constitute a PCB (generally labeled as 105). The PCB, as persons of ordinary skill in the art will understand, provides mechanisms or features such as traces, vias, etc., to electrically couple module 80 to other devices, features, subsystems, circuits, etc.

The PCB (or generally substrate) 105 features (or mechanisms or devices or components or parts) may also be used to implement the second portions of the resonator and radiator (or the combined resonator/radiator). Examples of such features include traces, conductive areas or planes, such as ground planes, etc. In the embodiment shown, features of substrate 105 is used to part of the resonator, labeled 85B, and part of the radiator, labeled 90B. Resonator parts or portions 85A and 85B are coupled together (electrically and/or physically) to form the overall resonator (e.g., resonator 25 in FIG. 2). Similarly, radiator parts or portions 90A and 90B are coupled together (electrically and/or physically) to form the overall radiator (e.g., radiator 30 in FIG. 2).

In exemplary embodiments, the material (or materials) used to fabricate substrate or PCB 105 may be selected based on a variety of considerations and attributes. For example, the PCB material may be selected so as to provide certain physical attributes, such as sufficient strength to support the various components coupled or affixed to PCB 105. As another example, the PCB material may be selected so as to provide certain electrical attributes, such as dielectric constant to provide desired electrical characteristics, e.g., reactance at a given or desired frequency, desired overall resonator electrical characteristics, and/or desired overall radiator electrical characteristics.

By partitioning the resonator (e.g., resonator 25) and the radiator (e.g., radiator 30), antenna structure 15 is partitioned. For example, referring to FIG. 6, the resonator is partitioned into portion 85A and portion 85B. In addition, or instead, the radiator is partitioned into portion 90A and portion 90B. Given that antenna structure 15 includes the resonator and the radiator, antenna structure 15 is partitioned as shown in the figure and described above. In embodiments where the resonator and the radiator are combined, partitioning the resulting resonator/radiator also results in antenna structure 15 being partitioned.

Partitioned antenna structures according to exemplary embodiments provide several features and attributes. For example, partitioned antenna structures provide effective tuning of the antenna (e.g., chip antenna 20), rather than merely relying on techniques that involve changing the dielectric materials in relatively close proximity of the antenna, changing packaging materials (e.g., molding materials) or dimensions, or changing the dimensions or characteristics of a substrate (e.g., PCB) to which module 80 is affixed. Consequently, efficient or effective tuning of the antenna for a given application that uses module 80 is possible even if relatively significant detuning occurs because of various factors (e.g., molding and plastic layers, whether used in module 80 or externally to module 80). Thus, tuning of the antenna may be accomplished in a relatively flexible manner and with potentially lower costs (e.g., because of smaller module sizes, etc.).

Moreover, given that module 80 includes portions, rather than the entire, resonator and radiator, the module size is reduced. The reduced size of module 80 provides reduced board area, reduced cost, increased flexibility, etc. For example, resonator portion 85B and radiator 90B, which are fabricated externally to module 80 (e.g., using features or parts of substrate 105) may be sized or configured or fabricated to accommodate a desired RF frequency without changing characteristics of module 80. In other words, resonator portion 85B and radiator portion 90B, which are fabricated externally to module 80 (e.g., using features or parts of substrate 105) may be sized or configured or fabricated to provide effective RF transmission or reception, given the particular characteristics of a module 80.

Figure 7:
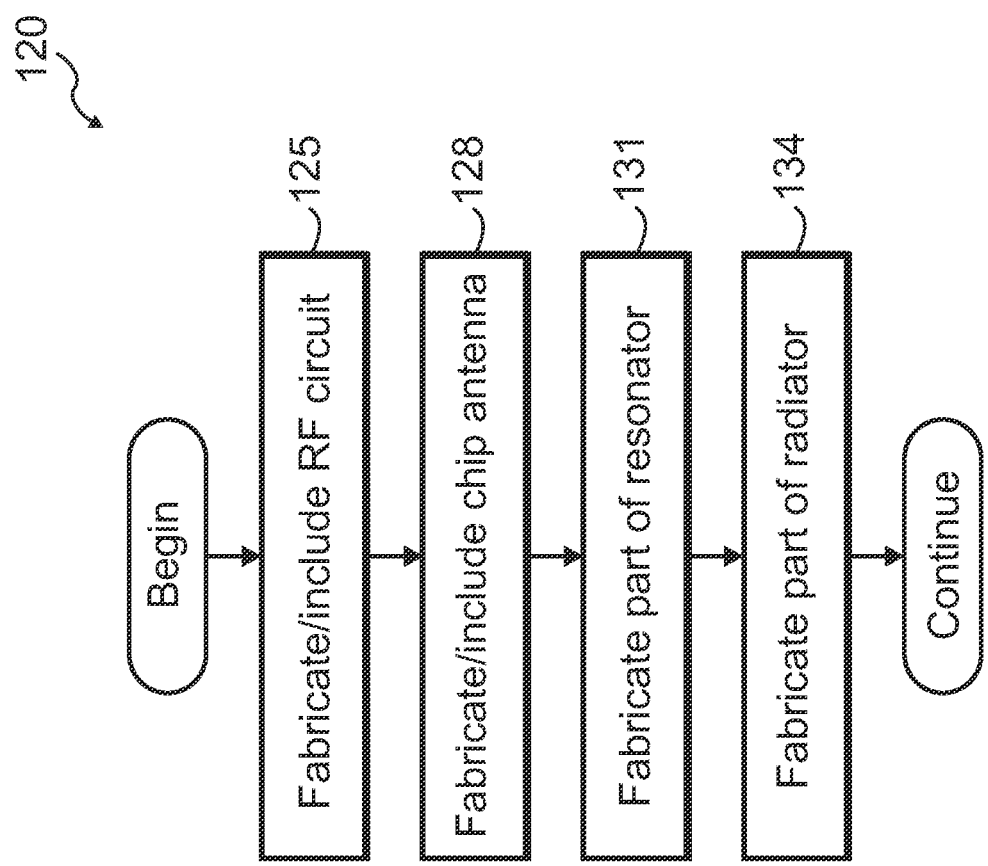
FIG. 7 shows a flow diagram for a process of making a module with a partitioned antenna structure according to an exemplary embodiment.

One aspect of the disclosure pertains to processes for making or using modules such as module 80. FIG. 7 illustrates a flow diagram 120 for a process of making a module with a partitioned antenna structure according to an exemplary embodiment. At 125, the RF circuit (e.g., RF circuit 35, described above) is fabricated and included in the module, as desired. (In embodiments where the RF circuit is already fabricated (e.g., a semiconductor die including the RF circuit), the fabricated RF circuit may be included in module 80. Furthermore, in embodiments where the RF circuit is external to the module, block 125 may be omitted.)

At 128, the chip antenna (e.g., chip antenna 20, described above) is fabricated and included in the module, as desired. (In embodiments where the chip antenna is already fabricated (e.g., as a separate component, obtained in a packaged form), the fabricated chip antenna may be included in module 80.)

At 131, a portion or part of the resonator (e.g., resonator 25 in FIG. 2) is fabricated and included in module 80. The portion or part of the resonator may constitute, for example, portion 85A shown in FIG. 5 and FIG. 6. In other words, the entire structure that forms the resonator is partitioned into two portions, as described above. One of those portions (e.g., portion 85A) is included in module 80.

Alternatively, or in addition, at 134, a portion or part of the radiator (e.g., radiator 30 in FIG. 2) is fabricated and included in module 80. The portion or part of the radiator may constitute, for example, portion 90A shown in FIG. 5 and FIG. 6. (Note that in embodiments that use a combined resonator and radiator, a portion of the resonator/radiator is fabricated and included in module 80). In other words, the entire structure that forms the radiator is partitioned into two portions, as described above. One of those portions (e.g., portion 90A) is included in module 80.

Figure 8:
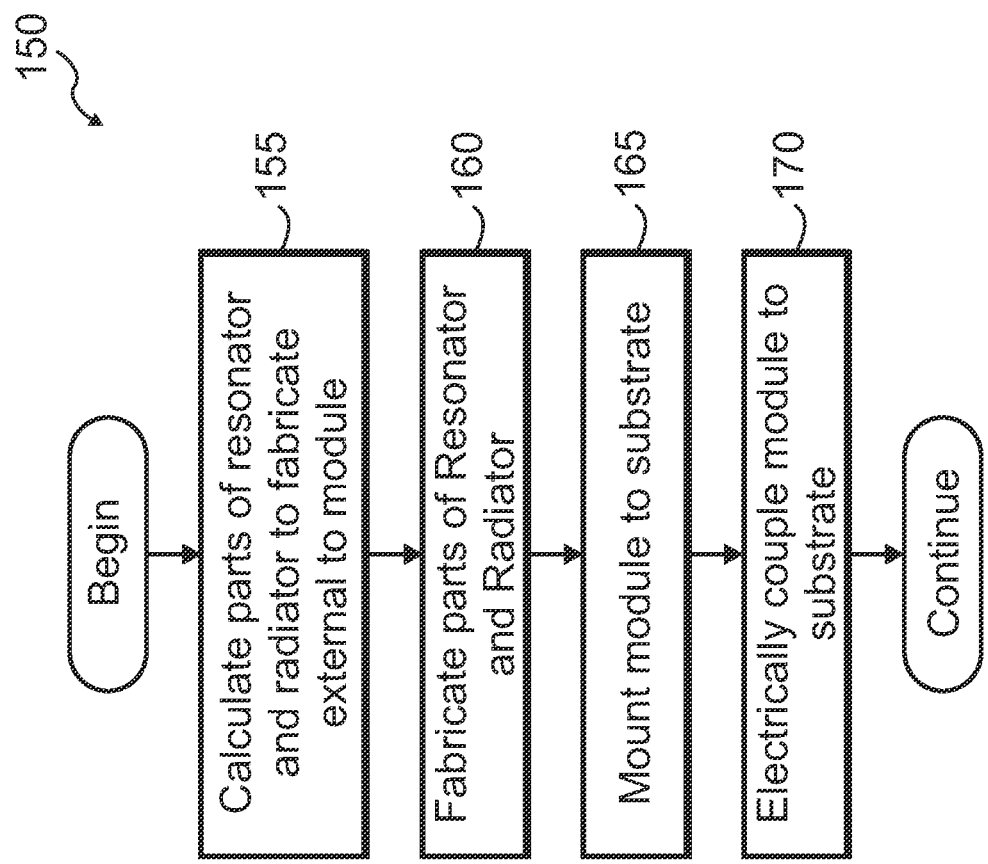
FIG. 8 shows a flow diagram for a process of making an RF apparatus with a partitioned antenna structure according to another exemplary embodiment.

FIG. 8 shows a flow diagram 150 for a process of making an RF apparatus with a partitioned antenna structure according to another exemplary embodiment. The process shown in FIG. 8 assumes that a portion of the resonator and a portion of the radiator (or a portion of the resonator/radiator) are included in a module, such as module 80, as described above (although the process may be used with other embodiments, as desired, by making appropriate modifications).

At 155, characteristics of the portions of the resonator and radiator (e.g., portions 85B and 90B, described above) that are external to the module, e.g., fabricated or included in substrate 105 in FIG. 6, are determined or calculated. Such characteristics include size of various features (e.g., ground plane), material characteristics (e.g., dielectric constants), etc.

At 160, the portions of the resonator and radiator that are external to the module are fabricated using features of a substrate, e.g., substrate 105, described above. At 165, the module is mounted to the substrate. At 170, the module is coupled electrically to the substrate, for example, coupling portion 85A to portion 85B, coupling portion 90A to portion 90B, power and ground connections, RF signal paths, etc. Note that in some embodiments, mounting of the module and electrically coupling the module to the substrate may be performed together (e.g., by soldering the module to the substrate).

Figure 9:
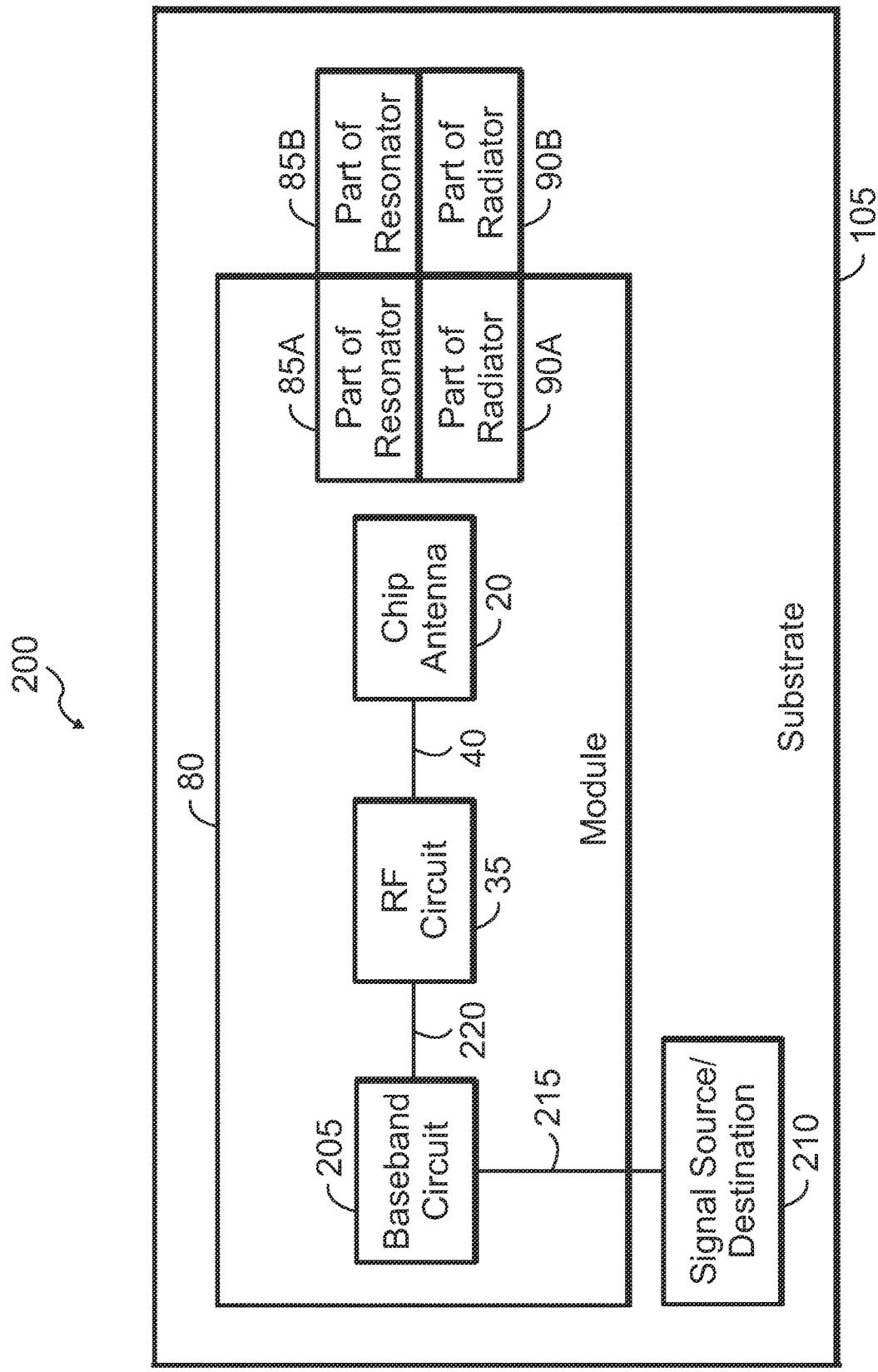
FIG. 9 shows an RF apparatus with a partitioned antenna structure according to another exemplary embodiment.

One aspect of the disclosure relates to including circuitry in an RF apparatus using substrate 105 to provide most or all components for an RF communication apparatus (e.g., receiver, transmitter, transceiver). FIG. 9 illustrates an RF communication apparatus 200 with a partitioned antenna structure according to another exemplary embodiment.

As described above, module 80 and portions 85B and 90B fabricated/included in or on substrate 105 provide RF circuitry for the RF apparatus. In addition, RF communication apparatus 200 includes baseband circuit 205 and signal source/destination 210. In the embodiment shown, baseband circuit 205 is included in module 80. Baseband circuit 205 couples to RF circuit 35 via link 220.

In the case of RF reception, using link 220, baseband circuit may receive signals from RF circuit 35, and convert those signals to baseband signals. The conversion may include frequency translation, decoding, demodulating, etc., as persons of ordinary skill in the art will understand. The signals resulting from the conversion are provided signal source/destination 210 via link 215. In the case of RF reception, signal source/destination 210 may include a signal destination, such as a speaker, a storage device, a control circuit, transducer, etc.

In the case of RF transmission, signal source/destination 210 may include a signal source, such as a transducer, a microphone, sensor, a storage device, a control circuit, etc. The signal source provides signals that are used to modulate RF signals that are transmitted. Baseband circuit 205 receives the output signals of the signal source via link 215, and converts those signals to output signals that it provides to RF circuit 35 via link 220. The conversion may include frequency translation, encoding, modulating, etc., as persons of ordinary skill in the art will understand. RF circuit 35 uses the partitioned antenna structure to communicate RF signals via a medium such as air.

Figure 10:
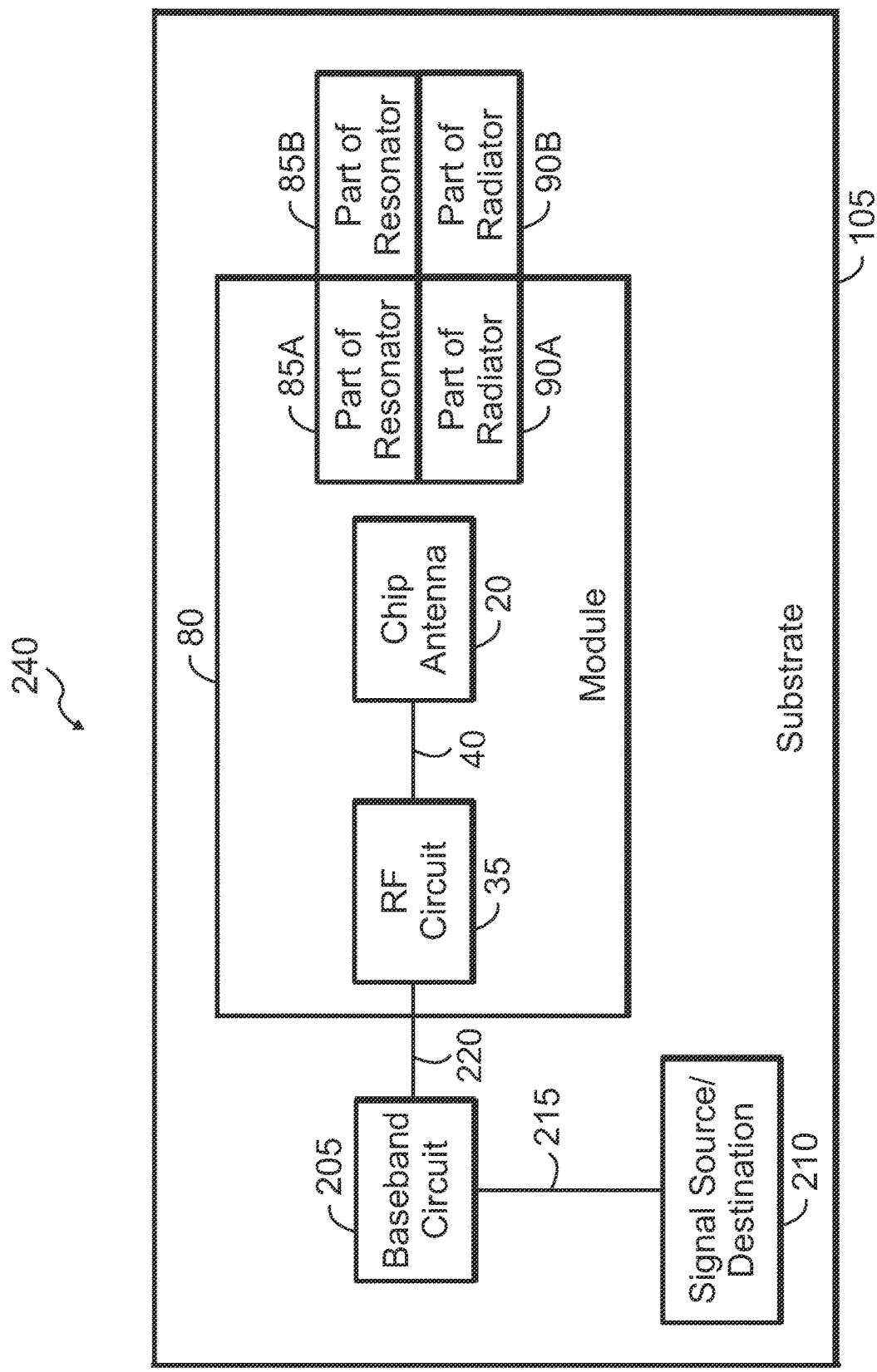
FIG. 10 shows an RF apparatus with a partitioned antenna structure according to another exemplary embodiment.

In some embodiments, baseband circuit 205 may be omitted from module 80, and instead be affixed to substrate 105. For example, a semiconductor die or IC that contains or integrates baseband circuit 205 may be affixed to substrate 205 and may be coupled to module 80. FIG. 10 shows an RF communication apparatus 240 that includes such an arrangement. Link 220 provides a coupling mechanism between baseband circuit 205 and RF circuit 35, as described above. RF communication apparatus 240 provides the functionality described above in connection with FIG. 10. Including baseband circuit 205 in module 80 facilitates certification of module 80 for a given standards or protocol, as desired.

Another aspect of the disclosure relates to apparatus for impedance matching circuits (or matching circuits or matching networks or matching circuitry or impedance matching networks or impedance matching circuitry) in RF apparatus, and associated methods. As persons of ordinary skill in the art will understand, impedance matching circuits may be called simply "matching circuits" without loss of generality.

Impedance matching or impedance transformation circuits, here called matching circuits, are typically used in RF apparatus, such as receivers, transmitters, and/or transceivers, to provide an interface or match between circuitry that have different impedances.

More specifically, in the case of purely resistive impedances, maximum power transfer takes place when the output impedance of a source circuit equals the input impedance of a load circuit. In the case of complex impedances, maximum power transfer takes place when the input impedance of the load circuit is the complex conjugate of the output impedance of the source circuit.

As an example, consider an antenna with a 50-ohm impedance (R=50Ω) coupled to a receive or receiver (RX) circuit with a 50-ohm impedance. In this case, maximum power transfer takes place without the user of an impedance matching circuit because the output impedance of the antenna equals the input impedance of the RX circuit.

Now consider the situation where an antenna with a 50-ohm impedance (R=50Ω) coupled to an RX circuit with a 250-ohm impedance. In this case, because the respective impedances of the antenna and the RX circuit are not equal, maximum power transfer does not take place.

Use of an impedance matching circuit, however, can match the impedance of the antenna to the impedance of the RX circuit. As a result of using the impedance matching circuit, maximum power transfer from the antenna to the RX circuit takes place.

More specifically, the impedance matching circuit is coupled between the antenna and the RX circuit. The impedance matching circuit has two ports, with one port coupled to the antenna, and another port coupled to the RX circuit, respectively.

At the port coupled to the antenna, the impedance matching circuit ideally presents a 50-ohm impedance to the antenna. As a result, maximum power transfer takes place between the antenna and the impedance matching circuit.

Conversely, at the port coupled to the RX circuit, the impedance matching circuit presents a 250-ohm impedance to the RX circuit. Consequently, maximum power transfer takes place between the impedance matching circuit and the RX circuit.

In practice, the impedance matching circuit often fails to perfectly match the impedances. In other words, signal transmission from one network to another is not perfect and 100% of the signal power is not transmitted. As a result, reflection occurs at the interface between circuits or networks with imperfectly matched impedances.

The reflection coefficient, S11, may serve as one measure or figure of merit for the level of impedance matching. A lower S11 denotes better power transmission (better impedance matching), and vice-versa.

In exemplary embodiments, impedance matching circuits or apparatus including impedance matching circuits, and associated methods are disclosed. The impedance matching circuits are relatively low cost, may be used with RF receivers (RX), RF transmitter (TX), and/or RF transceivers.

Furthermore, impedance matching circuits according to various embodiments may be adapted to various operating frequency ranges, power levels, and RX circuit or RX and TX circuit impedances. In addition, impedance matching circuits according to various embodiments may be used with a variety of RX or RX and TX circuit configurations (e.g., low-IF receivers, direct conversion receivers or transmitters, etc.), as persons of ordinary skill in the art will understand.

According to one aspect of the disclosure, matching circuits are provided in RF apparatus that match the impedance of an antenna (more particularly, a loop antenna in some embodiments, as described below in detail) to the impedance of an RF circuit. The matching circuits provide the impedance matching functionality without using chip or ceramic antennas. In other words, according to this aspect of the disclosure, RF apparatus include an RF circuit, a matching circuit, and an antenna.

Instead of using chip antennas, matching circuits are used that use lumped components or elements, such as reactive components (inductor(s), capacitor(s)). In some embodiments, the reactive components constitute surface mount device (SMD) components. Other types of components, however, may be used, depending on various factors, as persons of ordinary skill in the art will understand. Examples of such factors include the frequency of operation, cost, available space, performance specifications, design specifications, available technology, etc., as persons of ordinary skill in the art will understand.

The matching circuits obviate the use of chip antennas in such RF apparatus. Avoiding the use of chip antennas provides some benefits. For example, the overall cost of the RF apparatus may be decreased by avoiding the use of or eliminating the chip antenna.

Figure 11:
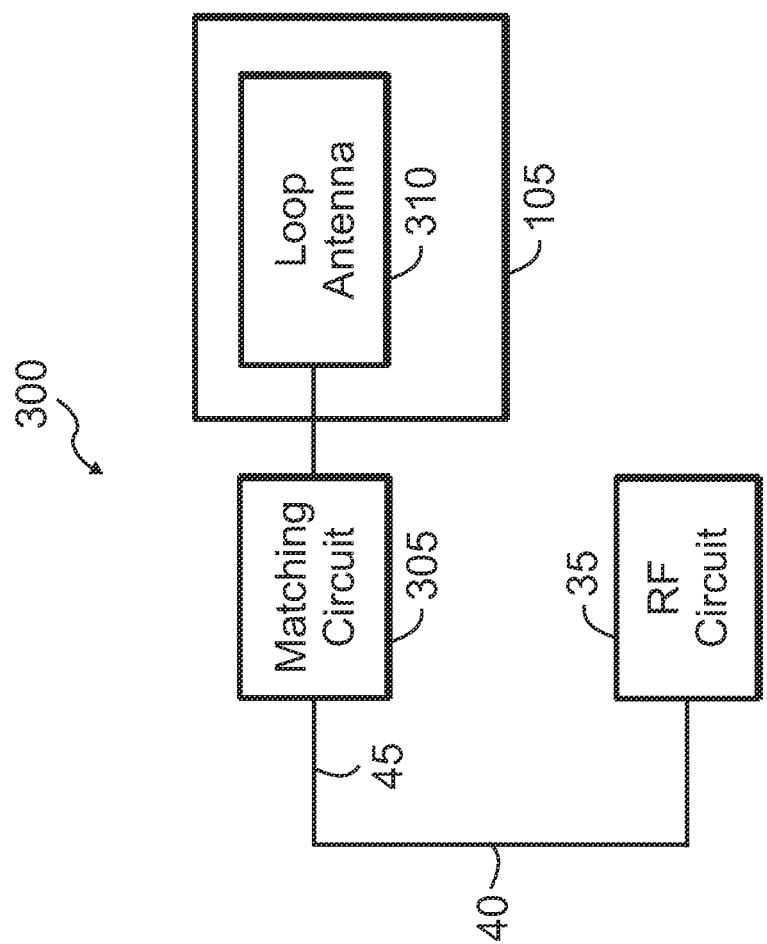
FIG. 11 shows a circuit arrangement for an RF apparatus (or part of an RF apparatus) according to an exemplary embodiment.

FIG. 11 depicts a circuit arrangement for an RF apparatus (or part of an RF apparatus) 300 according to an exemplary embodiment. More specifically, the figure illustrate the electrical connections or couplings among the various parts of RF apparatus 300. RF apparatus 300 includes loop antenna 310 which, as described below in detail, is formed in or on substrate 105. RF circuit 35 couples to matching circuit 305 via link 40. In exemplary embodiments, RF circuit 35 may include transmit (TX), receive (RX), or both transmit and receive (transceiver) circuitry. In the transmit mode, RF circuit 35 uses loop antenna 310 to transmit RF signals. In the receive mode, RF circuit 35 receives RF signals via loop antenna 310. In the transceiver mode, RF circuit 35 can receive RF signals during some periods of time and alternately transmit RF signals during other periods of time (or perform neither transmission nor reception, if desired). Thus, the transceiver mode may be thought of as combining the transmit and receive modes in a time-multiplexed fashion.

Link 40 provides an electrical coupling to provide RF signals from RF circuit 35 to matching circuit 305, alternatively, provide RF signals from antenna matching circuit 305 to RF circuit 35 (during the transmit and receive modes, respectively). Generally, link 40 constitutes a transmission line. In exemplary embodiments, link 40 may have or include a variety of forms, devices, or structures. For example, in some embodiments, link 40 may include a coaxial line or structures. As another example, in some embodiments, link 40 may include a stripline or microstrip structure (e.g., two conductors arranged in a length-wise parallel fashion). Other types of structures may be used to realize link 40, as persons of ordinary skill in the art will understand.

Regardless of the form of link 40, link 40 couples to matching circuit 305 at feed point or node 45. In some embodiments, feed point 45 may include a connector, such as an RF connector. In some embodiments, feed point 40 may include electrical couplings (e.g., points, nodes, solder joints, solder balls, vias, etc.) to couple link 40 to matching circuit 305. Feed point 45 provides RF signals to matching circuit 305 and, ultimately, to loop antenna 310 (during the transmit mode) or, alternately, provides RF signals from loop antenna 310, which are provided to link 40 by matching circuit 305 (during the receive mode).

Figure 12:
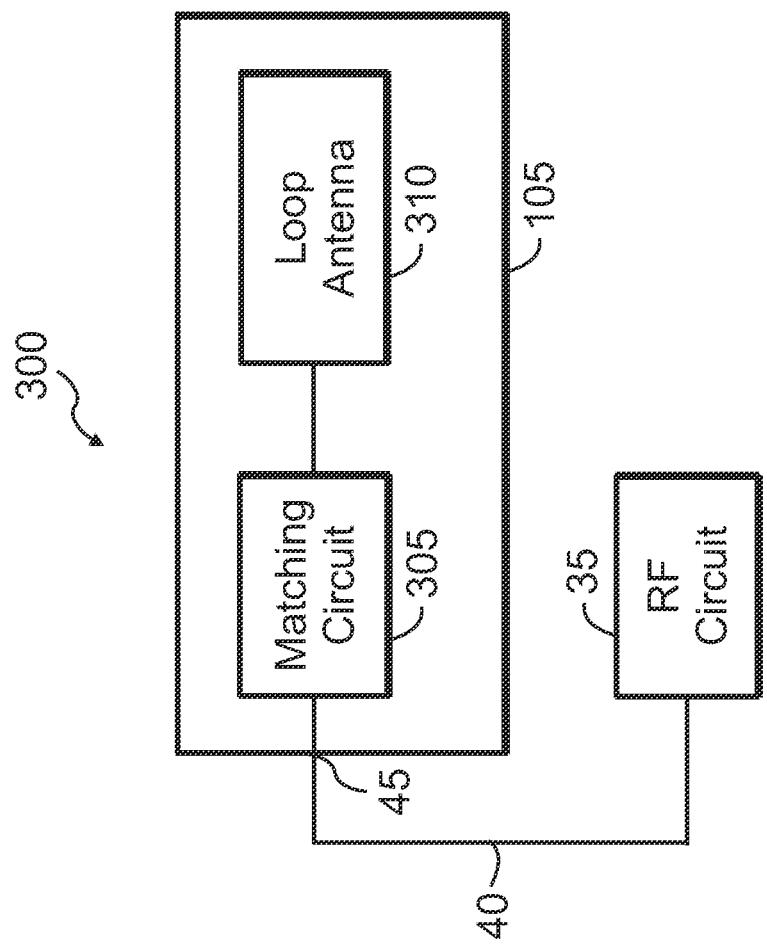
FIG. 12 shows a circuit arrangement for an RF apparatus (or part of an RF apparatus) according to another exemplary embodiment.
Figure 13:
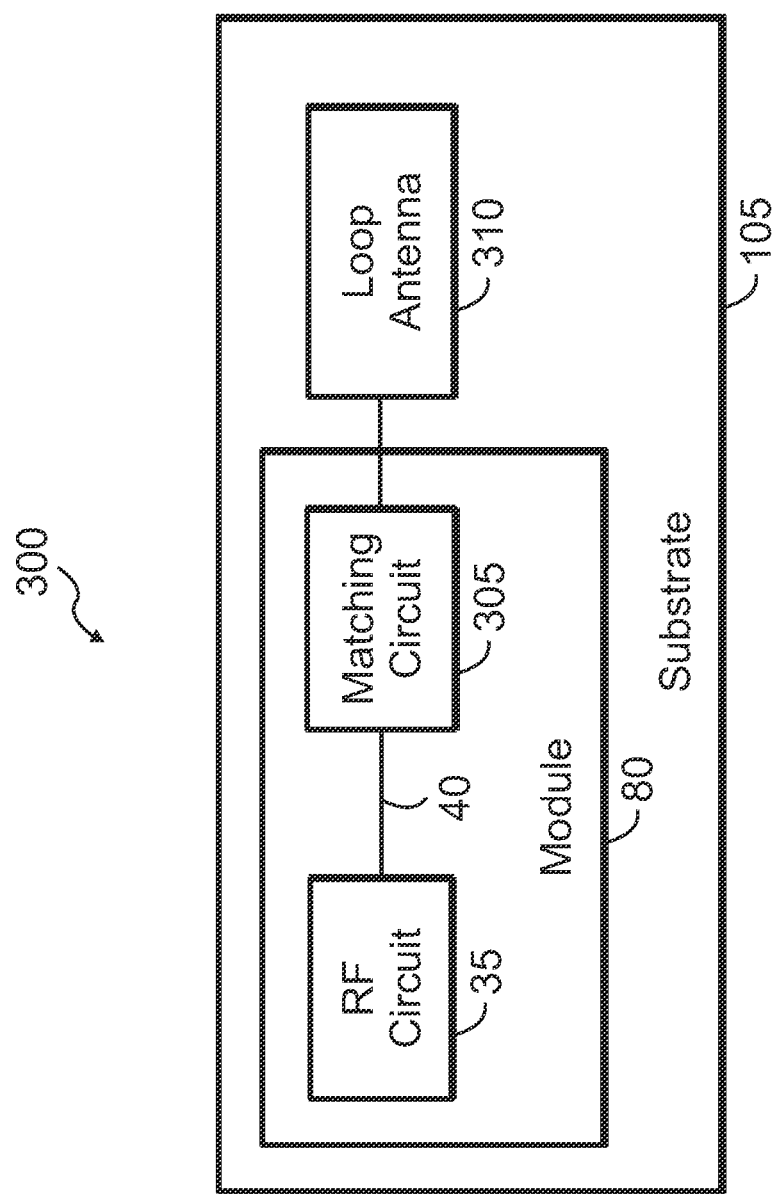
FIG. 13 shows a circuit arrangement for an RF apparatus (or part of an RF apparatus) according to another exemplary embodiment.

In some embodiments, matching circuit 305 may be formed in, on, or using various features of, substrate 105. FIG. 12 shows such an embodiment. In some embodiments, a module, such as an RF module, or semiconductor die, is used. FIG. 13 shows such an embodiment.

Referring to FIG. 13, a variety of alternatives are contemplated and are possible. For example, in some embodiments, module 80 may have its own package. In such embodiments, the package of module 80 is mounted, affixed, or attached to substrate 105, either directly (e.g., soldered), by using a carrier, etc. As another example, in some embodiments, module 80 may be formed or affixed or attached to its own substrate. In such embodiments, the substrate of module 80 is mounted, affixed, or attached to substrate 105, either directly (e.g., soldered), by using a carrier, etc.

Figure 14:
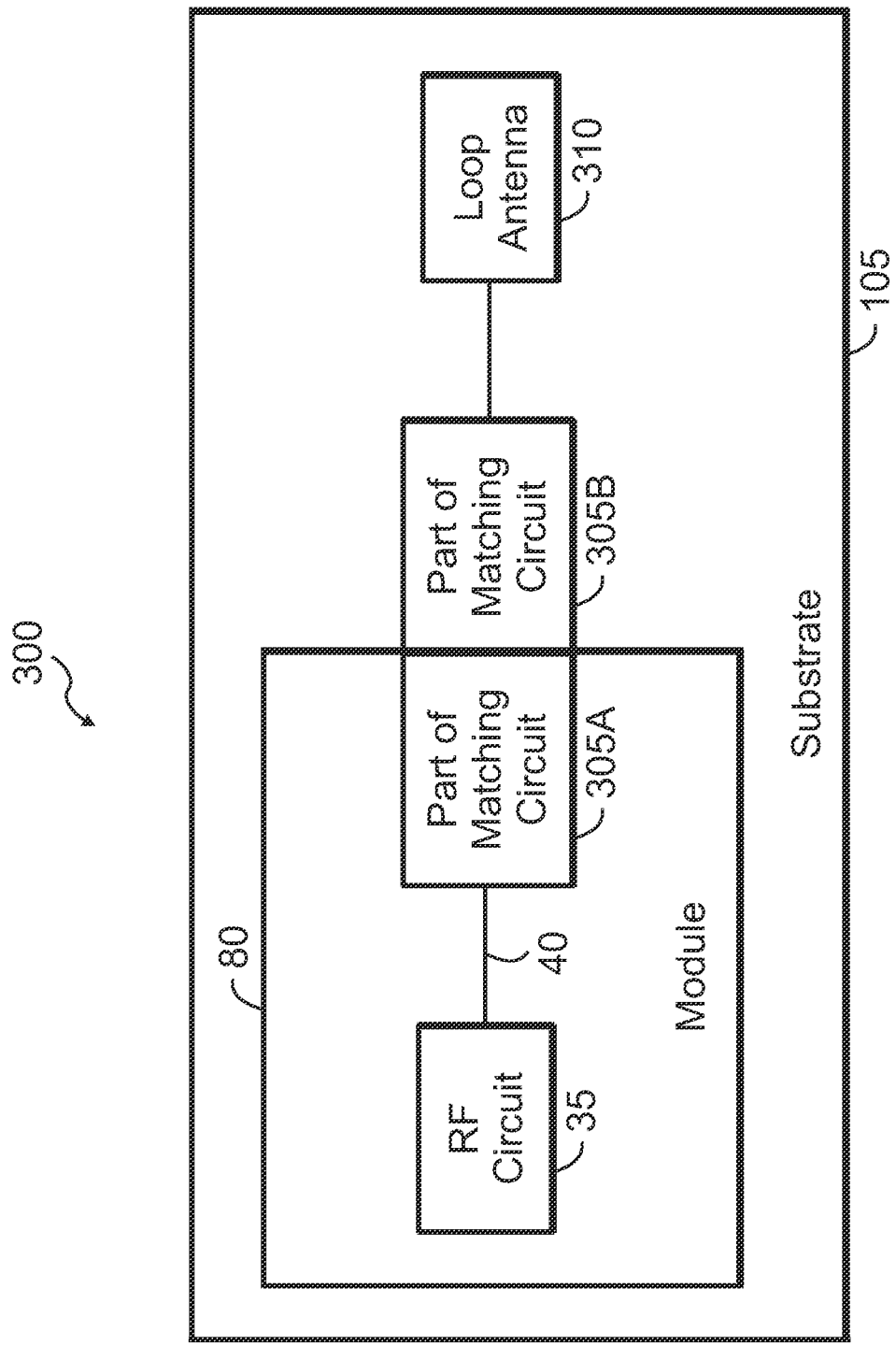
FIG. 14 shows a circuit arrangement for an RF apparatus (or part of an RF apparatus) according to another exemplary embodiment.

In some embodiments, matching circuit 305 is partitioned. In other words, a portion (or part) of the circuitry for matching circuit 305 is included in module 80, whereas another portion of matching circuit 305 is included in or formed in or formed on or formed using substrate 105. FIG. 14 shows such an embodiment. In the embodiment of FIG. 14, a portion 305A of matching circuit 305 is included in module 80. For example, some of the reactive components of matching circuit 305 may be included in module 80. Referring again to FIG. 14, another portion 305B of matching circuit 305 is realized using substrate 105. For example, substrate 105 may include conductive traces or patterns to which some of the reactive components of matching circuit 305 may be affixed (e.g., soldered). The conductive traces or patterns (e.g., patters of conductor formed in a PCB used to realize substrate 105) couple portion 305B of matching circuit 305 to loop antenna 310.

Figure 15:
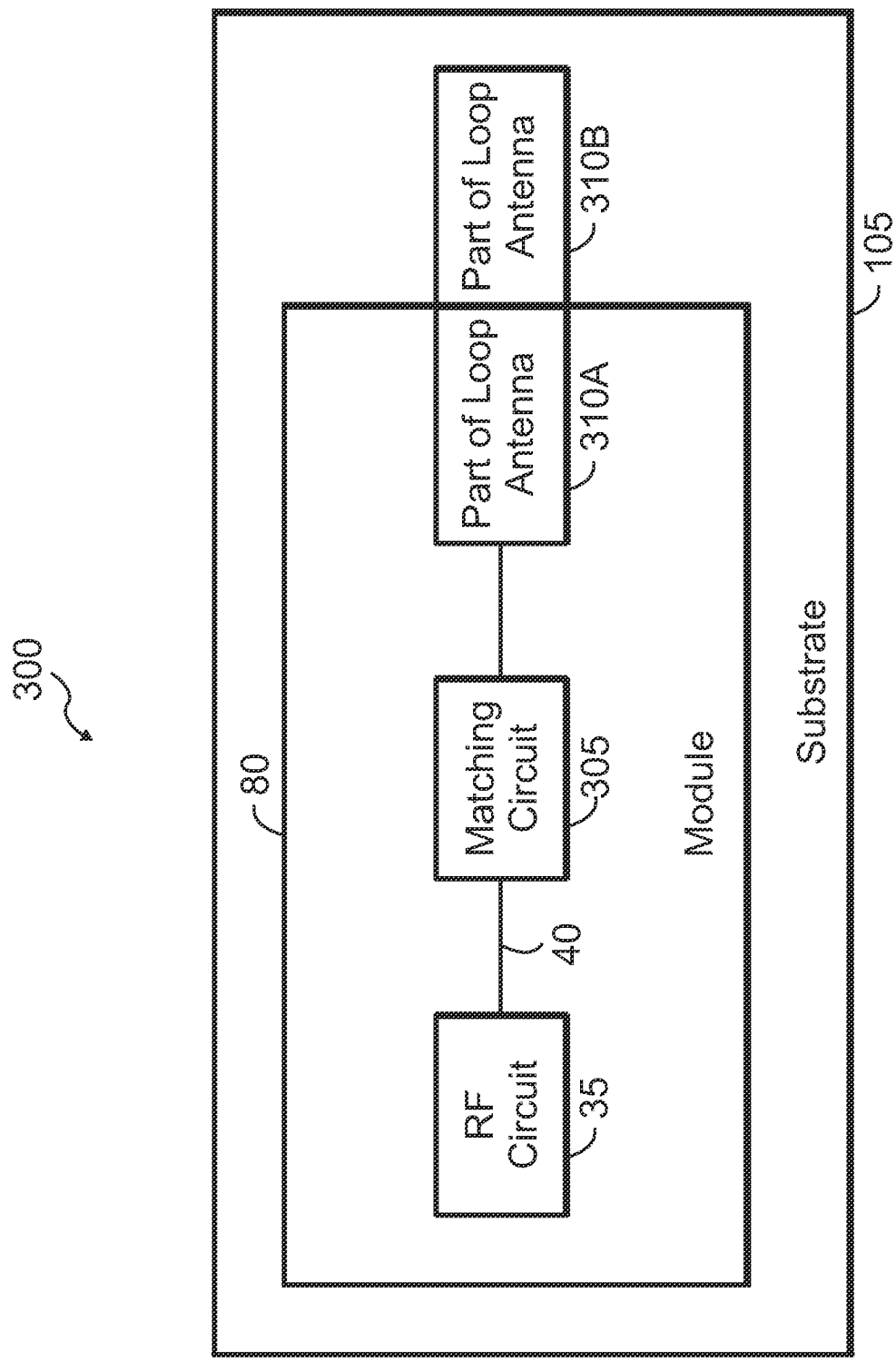
FIG. 15 shows a circuit arrangement for an RF apparatus (or part of an RF apparatus) according to another exemplary embodiment.

In some embodiments, loop antenna 310 is partitioned. In other words, a portion (or part) of loop antenna 310 is included in module 80, whereas another portion of loop antenna 310 is included in or formed in or formed on or formed using substrate 105. FIG. 15 shows such an embodiment. In the embodiment of FIG. 15, a portion 310A of loop antenna 310 is included in module 80. For example, conductor traces or conductors or conductor patterns in module 80 may be used to implement portion 310A of loop antenna 310. Referring again to FIG. 14, another portion 310B of loop antenna 310 is realized using substrate 105. For example, substrate 105 may include conductive traces or patterns used to realize or implement portion 310B of loop antenna 310. The conductive traces or patterns (e.g., patters of conductor formed in a PCB used to realize substrate 105) couple portion 310B of loop antenna 310 to matching circuit 305.

Figure 16:
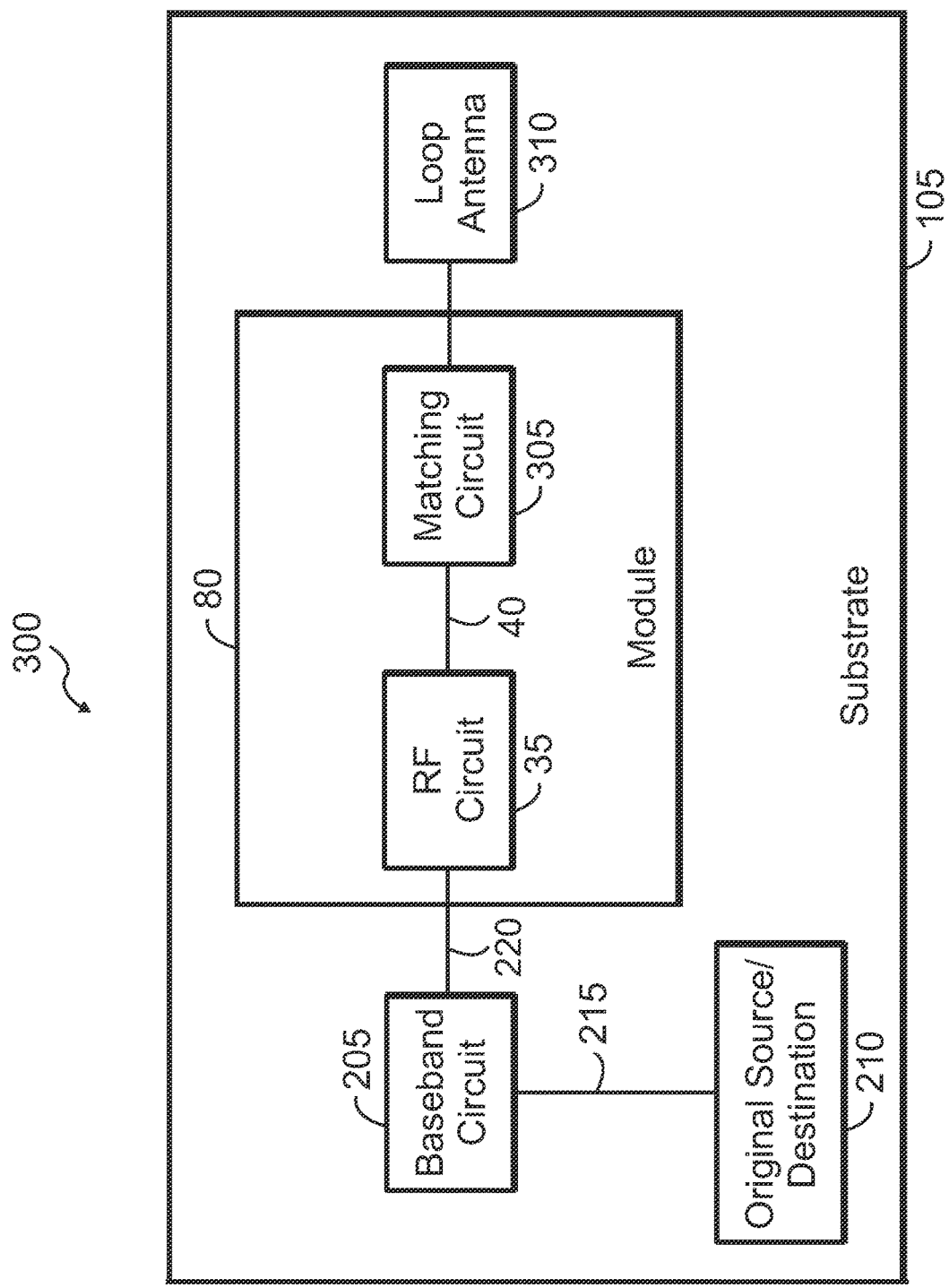
FIG. 16 shows a circuit arrangement for an RF apparatus (or part of an RF apparatus) according to another exemplary embodiment.

One aspect of the disclosure relates to including circuitry in an RF apparatus using substrate 105 to provide some or all components for an RF apparatus (e.g., receiver, transmitter, transceiver) 300. FIG. 16 illustrates an RF communication apparatus 300 with matching circuit 305, included in module 80 (as described above in connection with FIG. 13), according to an exemplary embodiment. Referring to FIG. 16, in addition, RF apparatus 300 includes baseband circuit 205 and signal source/destination 210. In the embodiment shown, baseband circuit 205 is external to module 80, and couples to RF circuit 35 via link 220.

In the case of RF reception, using link 220, baseband circuit may receive signals from RF circuit 35, and convert those signals to baseband signals. The conversion may include frequency translation, decoding, demodulating, etc., as persons of ordinary skill in the art will understand. The signals resulting from the conversion are provided signal source/destination 210 via link 215. In the case of RF reception, signal source/destination 210 may include a signal destination, such as a speaker, a storage device, a control circuit, transducer, etc., as persons of ordinary skill in the art will understand. In the case of RF transmission, signal source/destination 210 may include a signal source, such as a transducer, a microphone, sensor, a storage device, a data source, a control circuit, etc. The signal source provides signals that are used to modulate RF signals that are transmitted. Baseband circuit 205 receives the output signals of the signal source via link 215, and converts those signals to output signals that it provides to RF circuit 35 via link 220. The conversion may include frequency translation, encoding, modulating, etc., as persons of ordinary skill in the art will understand. RF circuit 35 uses matching circuit 305 to provide the RF signals to loop antenna 310 for transmission via a medium, such as air or vacuum.

Figure 17:
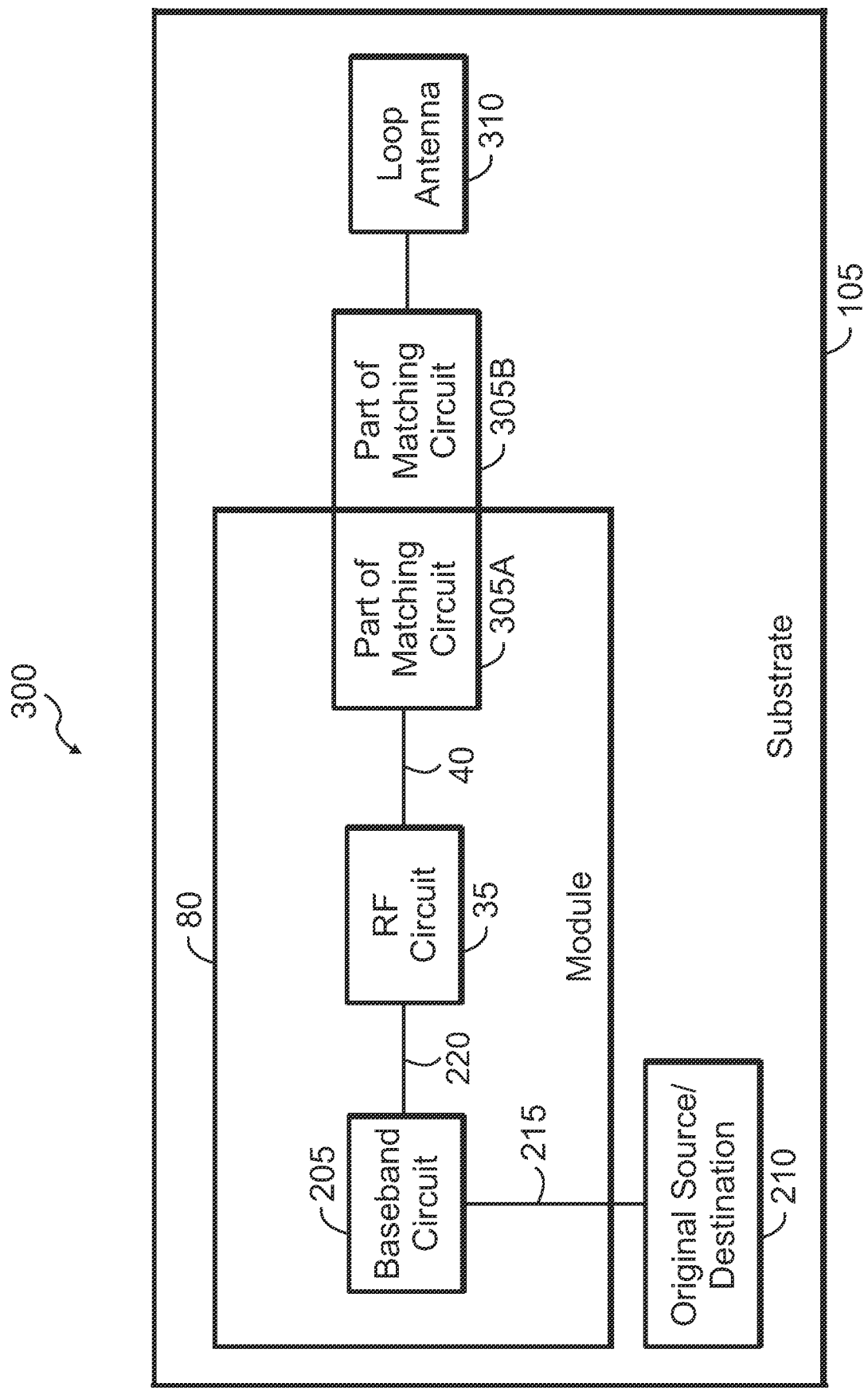
FIG. 17 shows a circuit arrangement for an RF apparatus (or part of an RF apparatus) according to another exemplary embodiment.

In some embodiments, a portion or part of matching circuit 305 is included in module 80, whereas another portion or part of matching circuit 305 is external to module 80. FIG. 17 shows such an embodiment. Similar to the embodiment of FIG. 14, in the embodiment in FIG. 17, a portion 305A of matching circuit 305 is included in module 80. Another portion 305B of matching circuit 305 is external to module 80, for instance, realized using substrate 105, as described above.

Figure 18:
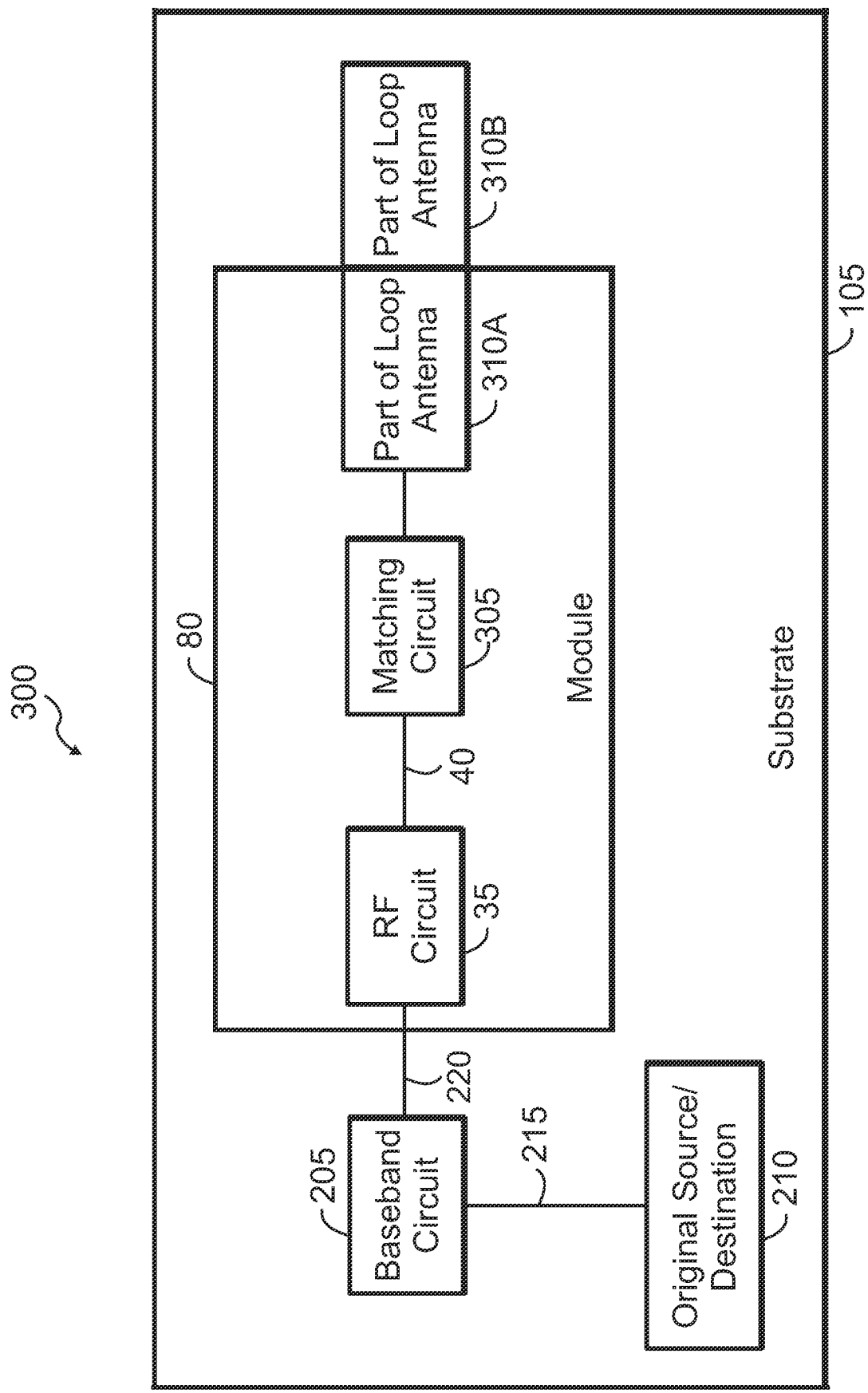
FIG. 18 shows a circuit arrangement for an RF apparatus (or part of an RF apparatus) according to another exemplary embodiment.

In some embodiments, a portion (or part) of loop antenna 310 is included in module 80, whereas another portion of loop antenna 310 is external to module 80. FIG. 18 shows such an embodiment. Similar to the embodiment of FIG. 15, in the embodiment in FIG. 18, a portion 310A of loop antenna 310 is included in module 80. Another portion 310B of loop antenna 310 is external to module 80, for example, realized using substrate 105, as described above.

Figure 19:
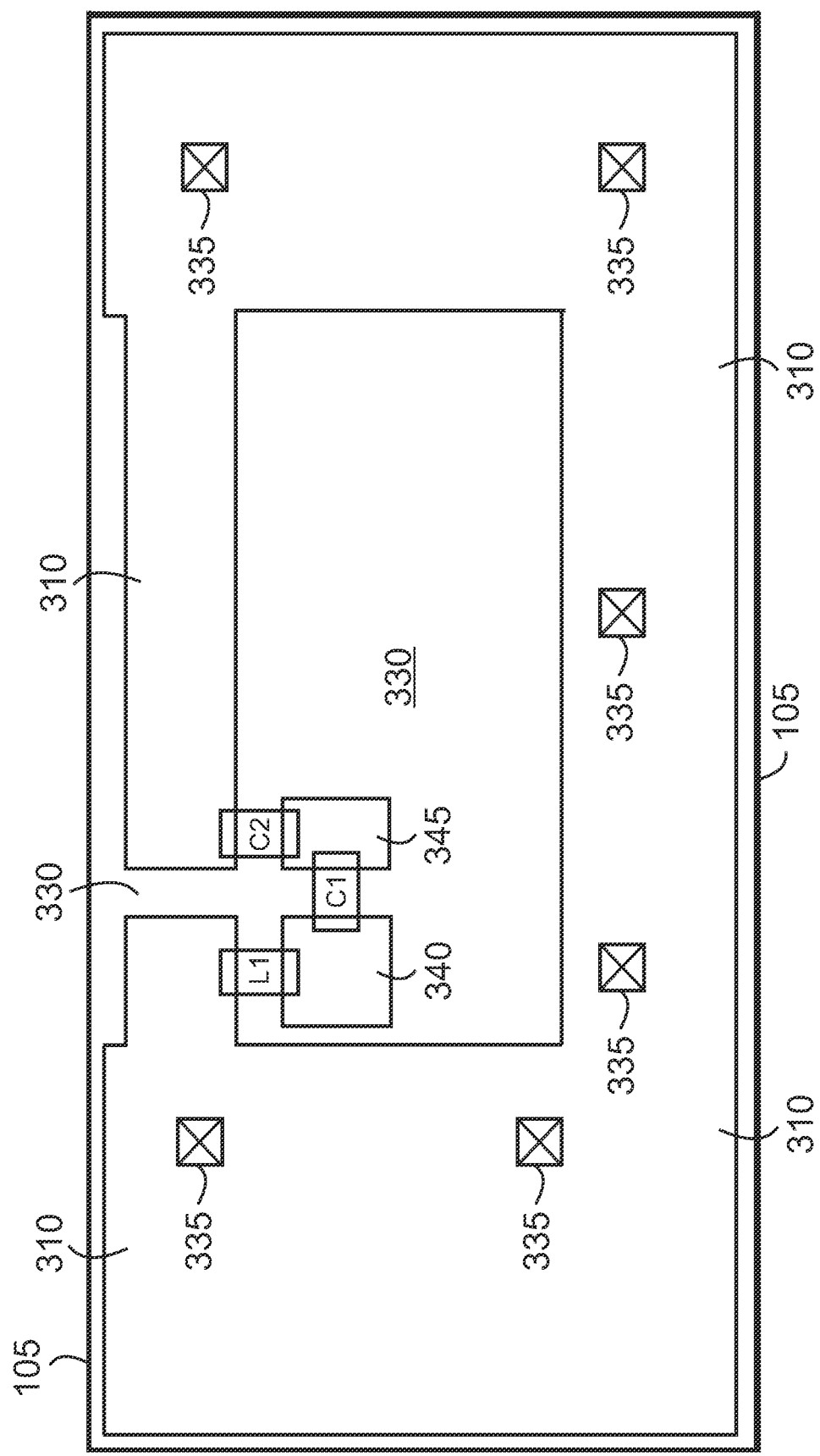
FIG. 19 shows a layout for an RF apparatus (or part of an RF apparatus) according to an exemplary embodiment.

Another aspect of the disclosure relates to the physical layout of matching circuit 305 and antenna loop 310. FIG. 19 shows a layout for an RF apparatus (or part of an RF apparatus) according to an exemplary embodiment. More specifically, FIG. 19 shows a loop antenna that is implemented as a printed-loop-substrate-edge fringing field antenna. In other words, loop antenna 310 uses a conductive loop, implemented as an example using conductive patterns or traces formed in or on substrate 105 (e.g., a PCB), hence the label printed-loop. The conductive loop (e.g., printed-loop) is implemented at or near an edge (as shown in FIG. 19) of substrate 105, i.e., either near one or more edges of substrate 105 (as shown in FIG. 19), or at one or more edges of substrate 105, i.e., with no clearance (or nearly no clearance) between the conductive loop and the edge(s) of substrate 105.

Parts of substrate 105 are not used to implement loop antenna 310, e.g., parts of the conductive layer on a PCB are stripped or edged to generate voids 330 (i.e., areas not covered by a conductive layer). Conductive patterns or traces 340 and 345 are used to implement matching circuit 305. In the example shown, the RF feed is accomplished using conductive pattern 340 (i.e., a receiver (not shown) or transmitter (not shown) is coupled to conductive pattern 340. An inductor L1 is coupled between conductive pattern 340 and loop antenna 310. A capacitor C1 couples conductive pattern 340 to conductive pattern 345. A capacitor C2 is coupled between conductive pattern 345 and loop antenna 310.

Thus, a matching circuit is formed that includes inductor L1 and capacitors C1 and C2. The matching circuit formed in FIG. 19 is merely illustrative, and no limiting. As persons of ordinary skill in the art will understand, other matching circuits may be implemented, using lumped reactive components or elements, as described above, by using such components and one or more conductive patterns in or on substrate 105 to implement desired matching circuits. Loop antenna 310 is resonated by matching circuit 305.

Figure 20:
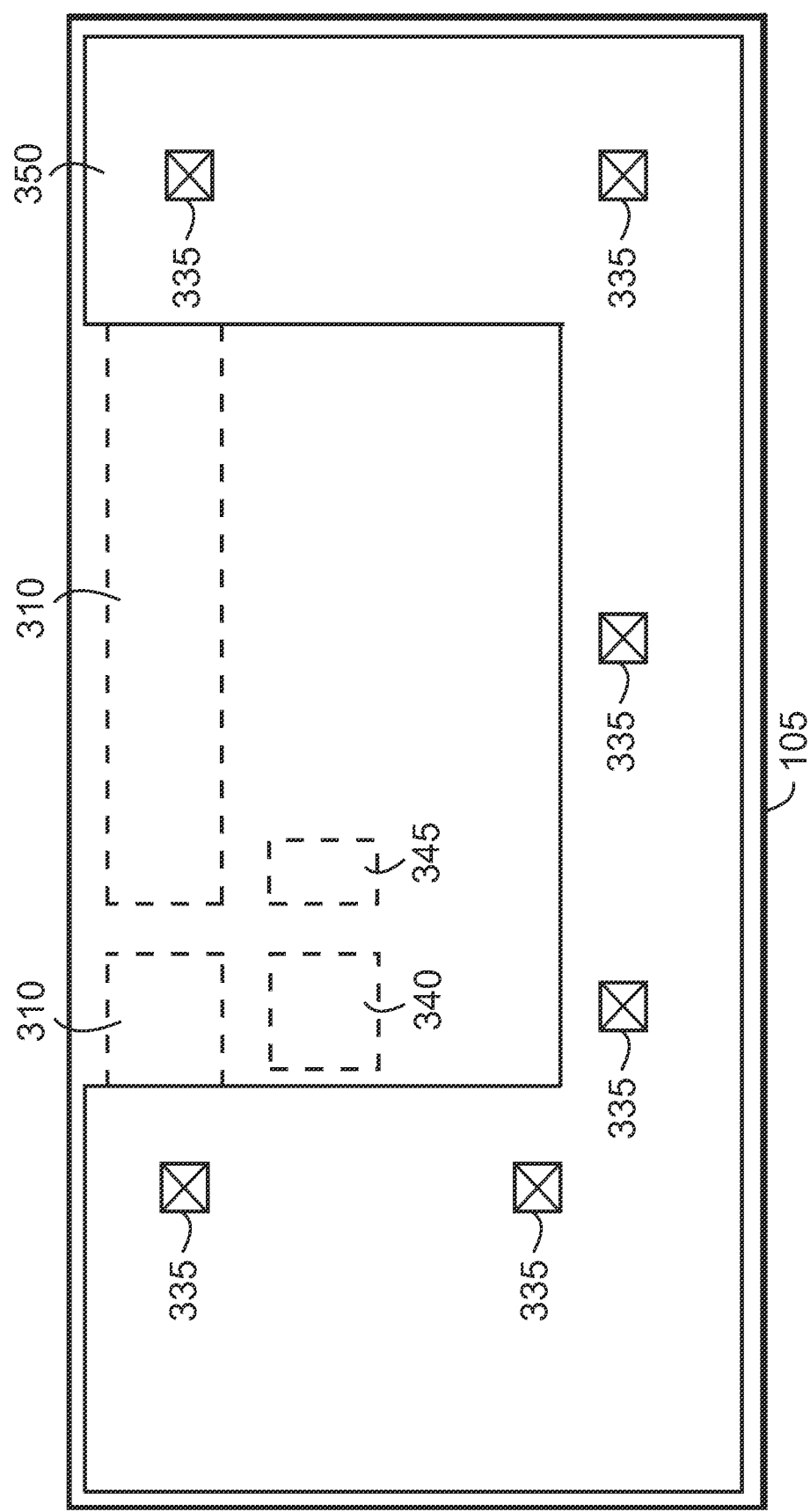
FIG. 20 shows a layout for an RF apparatus (or part of an RF apparatus) according to an exemplary embodiment.

Referring again to FIG. 19, a number of ground vias 335 are used to couple several points of loop antenna 310 to a ground plane (not shown). The ground plane may be formed using one or more internal layers of substrate 105 (e.g., internal layer(s) of a multi-layer PCB), or the bottom layer of substrate 105 (e.g., the bottom layer or reverse side of a PCB). FIG. 20 shows the layout for such an arrangement. More specifically, ground vias 335 couple loop antenna 310 (shown partially using dashed lines as it does not reside in the layer shown) to conductive pattern 350. Conductive pattern 350 constitutes a ground plane and, as noted, may be implemented using one or more internal layers or the bottom or reverse side or layer of substrate 105.

Figure 21:
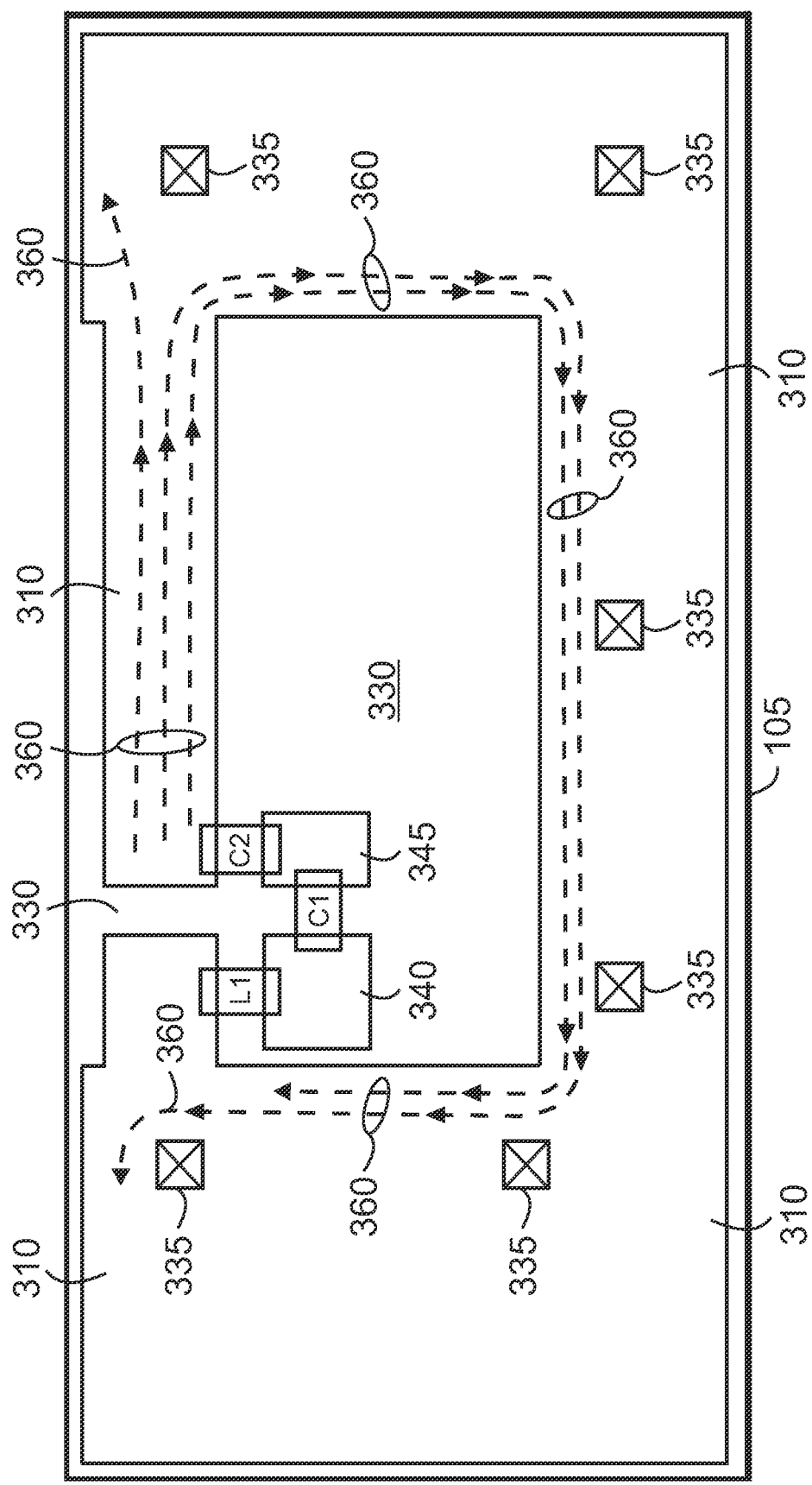
FIG. 21 shows a flow of currents in an RF apparatus (or part of an RF apparatus) according to an exemplary embodiment.

As noted above, loop antenna 310 is resonated by matching circuit 305, which gives rise to RF currents. FIG. 21 shows an example of RF current distribution in the layout shown in FIG. 19. Referring again to FIG. 21, RF currents 360 propagate generally along the top side of substrate 105, along the right side of substrate 105, along the bottom side of substrate 105, and along the left side of substrate 105, thus generating RF radiation. Some fringing currents flow along the top side or edge of substrate 105, as shown in FIG. 21. Such fringing currents generate fringing fields that also generate RF radiation. Note that although generally the conductive loop is radiating, the main radiator is along the edge(s) of substrate 105 because of relatively large size. Thus, without using a chip or ceramic antenna, loop antenna 310 uses the conductive loop and the edge(s) of substrate 105 as radiators, driven by matching circuits that use lumped reactive components or elements.

The size of the conductive loop in loop antenna 310 generally depends on the operating frequency (e.g., the frequency of an RF signal transmitted via loop antenna 310, or the frequency of an RF signal received via loop antenna 310). Thus, the size of the conductive loop and/or substrate 105 may be selected in order to accommodate desired operating frequencies. Various shapes of the conductive loop are also possible, and contemplated. Some conductive loops may be shaped and dimensioned so as to increase the bandwidth of loop antenna 310, or to accommodate relatively limited areas available around module 80 on substrate 105.

Generally, several techniques may be used to improve the performance of loop antenna 310: (a) using relatively narrow traces, relatively far from module 80, in order to decrease the loop area/dimensions that gives rise to self-capacitance; (b) increasing the distance between the conductive loop coupling mechanisms (pins, etc.) to reduce the parallel parasitic capacitance with matching circuit 305); and (c) increased conductive loop width and length to widen the bandwidth. Note that larger conductive loop areas may be achieved in a variety of ways, for instance, by widening the conductive loop, or by making it longer, which decreases the quality factor (Q) of the conductive loop, i.e., decrease the imaginary part of its impedance compared to the real part of its impedance.

Figure 22:
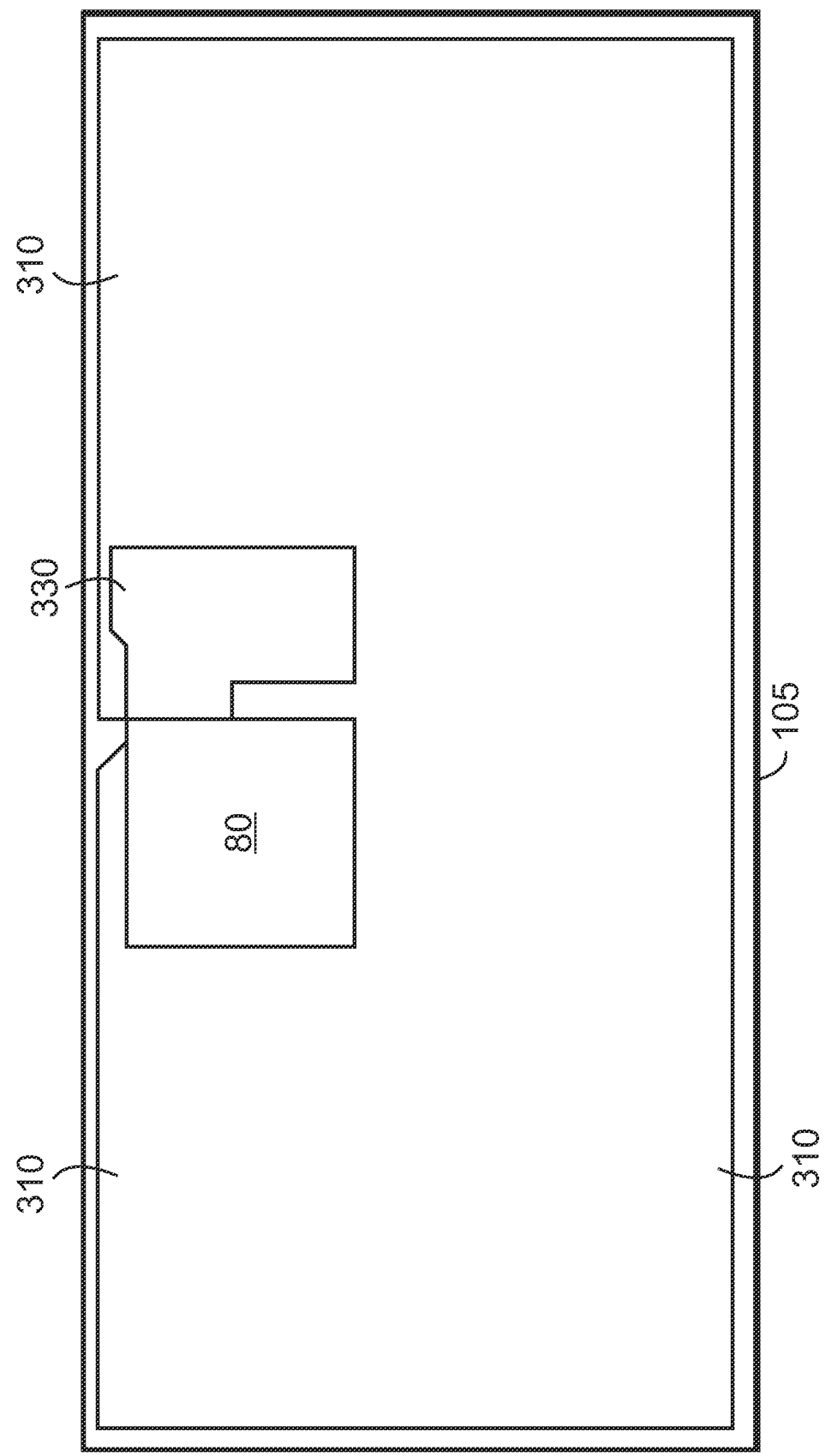
FIG. 22 shows a layout for an RF apparatus (or part of an RF apparatus) according to an exemplary embodiment.

As noted above, in some embodiments, a portion of matching circuit 305 (see, for example, FIG. 17) or a portion of loop antenna 310 (see FIG. 18) is included in module 80. In such embodiments, another portion of matching circuit 305 (see, for example, FIG. 17) or a portion of loop antenna 310 (see FIG. 18), respectively, is external to module 80, e.g., formed using substrate 105. FIG. 22 shows a layout for such embodiments. More specifically, module 80 is positioned (typically mounted or affixed or attached) with respect to substrate 105. Module 80 is electrically coupled to loop antenna 310. As noted in some embodiments, a portion of matching circuit 305 is included in module 80, whereas another portion of matching circuit 305 is laid out externally to module 80. Furthermore, as noted in some embodiments, a portion of loop antenna 310 is included in module 80, whereas another portion of loop antenna 310 is laid out externally to module 80.

Another aspect of the disclosure relates to antennas that are included or housed in the module 80. In some embodiments, a combined monopole-slotted loop antenna is included in the module 80. More specifically, in some embodiments, a combined monopole-slotted loop-LC resonant antenna is used. The antennas included in the module 80 according to various embodiments avoid using chip antennas or ceramic antennas. When used, the chip antennas cost, at today's prices, about 7 cents each in quantity. Using the antennas according to various embodiments reduced the cost to about 2 cents per antenna, as such antennas do not use any chip or ceramic antennas.

Rather, the antennas according to various embodiments use LC networks realized by discrete components (or distributed, depending on frequencies of operation of circuitry in the module 80) to excite and resonate the printed monopole antenna and the slotted (i.e., including a void, as described below) inductive loop formed by the clearance area or void situated in the module 80. In exemplary embodiments, the LC network may be disposed along the antenna trace, between the RF circuit that transmits or receives RF signals, and the loop antenna. The LC network provides impedance matching between the RF circuit and the loop antenna. In exemplary embodiments, that matching networks provide impedance matching for various frequencies or RF protocols or standards, including, without limitation, Bluetooth and Zigbee.

Furthermore, using antennas and matching circuits according to various embodiments allows using the original antenna clearance loop size and motherboard layout (as used, for example, with chip or ceramic antennas) and thus, are compatible with existing substrates or boards that incorporate or include the module 80. In addition, compared to previous solutions, antennas according to various embodiments provide more flexibility, increased degrees of freedom during the design phase, better tenability, and increased ease of optimization for different applications. Also there is no dependency on antenna vendors (because chip or ceramic antennas are not used), commercially available SMD components or elements (capacitors, inductors, etc.) can be used to implement the matching circuit, such as the LC network.

Figure 23:
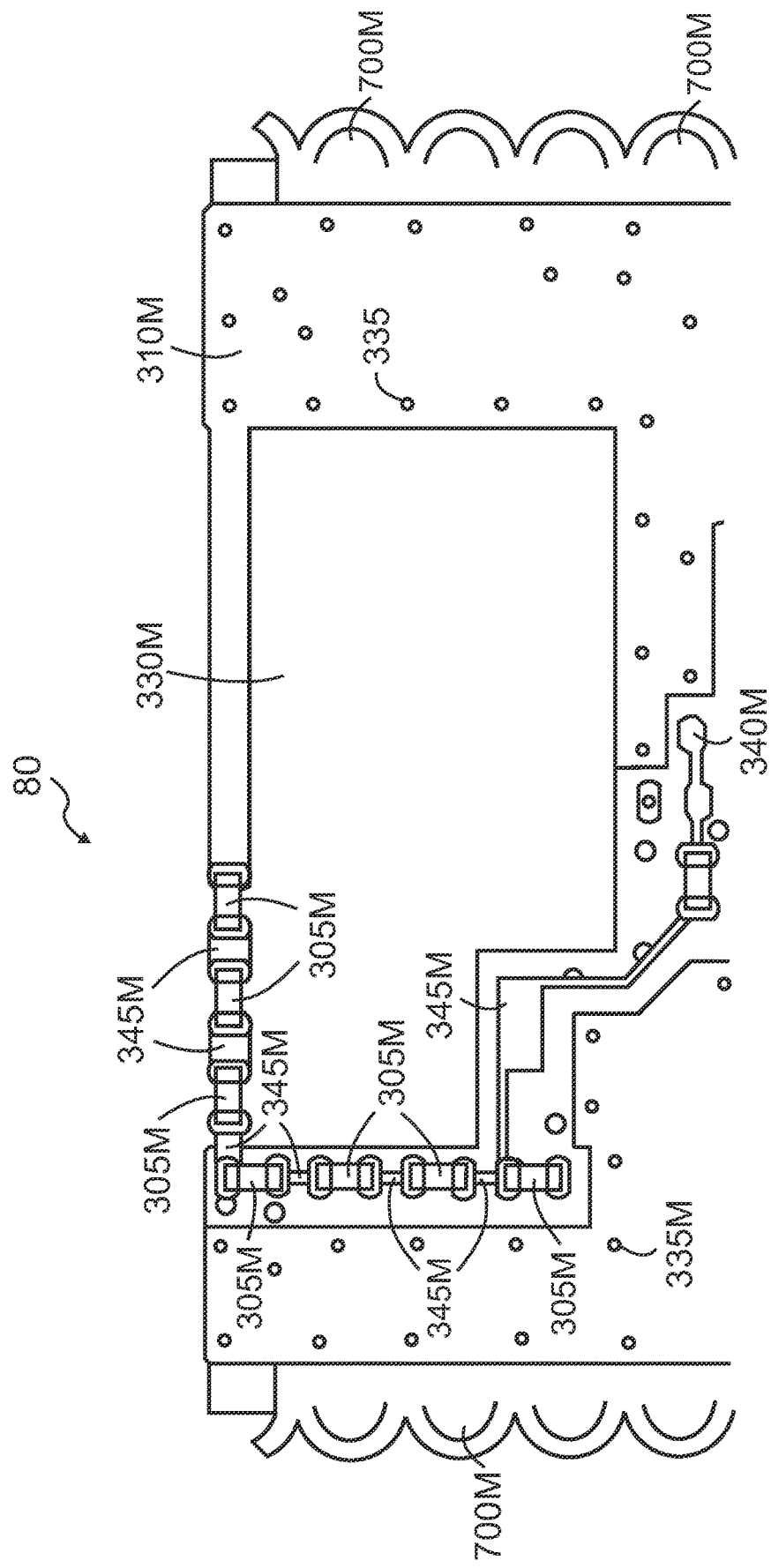
FIG. 23 shows a layout for a module according to an exemplary embodiment.

In various embodiments, a printed antenna trace, a slotted printed loop, and an LC network are used to form an antenna structure, which includes the matching circuit. The loop antenna is matched to an RF circuit and is tuned by the LC network. The radiation of RF energy is performed partly by the antenna trace in a monopole antenna fashion, partly by the slotted loop, and partly by the fringing fields at the edge of the substrate 105 to which the module 80 is attached or mounted. FIG. 23 shows a layout for a module 80 according to an exemplary embodiment that includes this concept.

The figure shows a partial layout of the module 80, specifically, the parts relating to the antenna and related matching circuit. The module 80 uses or includes a set of pins, pads, or generally coupling mechanisms 700M in order to electrically couple the module 80 to other circuit elements, such as the substrate 105 (not shown). Through the coupling mechanisms 700M, circuitry in the module 80, such as the matching circuit 305, couples to circuitry external to the module 80, e.g., the substrate 105, power supply, ground, etc., as persons of ordinary skill in the art will understand.

The RF circuit (whether transmitting or receiving; not shown) couples to the module conductive trace or pattern 340M. Through the module conductive pattern 340M, the RF circuit can provide RF signals to be transmitted or receive RF signals from the antenna. The module conductive pattern 340M is coupled to the module conductive pattern 345M, which couples the module conductive pattern 340M to the matching circuit. The matching circuit, as noted above, includes an LC network that includes elements or components 305M. Details of the matching circuit are described below.

Referring again to FIG. 23, the module matching circuit components 305M are coupled to the module loop antenna 310M. The module loop antenna 310M is similar to the loop antennas 310, described above (e.g., formed by conductive traces, such as PCB traces, module substrate conductive traces, etc., as persons of ordinary skill in the art will understand). The loop in the module loop antenna 310M is formed by providing the module void (or slot) 330M, which is similar to the voids 330, described above (e.g., formed by etching conductive patterns to fabricate a void or slot, etc., as persons of ordinary skill in the art will understand), but is formed in the module 80 (e.g., in the substrate of the module 80). The module loop antenna 310M is coupled to ground through the module ground vias 335M, which are similar to the ground vias 335, described above, but are formed in the module 80. RF radiation is caused or provided by the RF currents flowing in the module conductive pattern 345M and in the module loop antenna 310M. Some of the RF currents leak or conducted to the edge of the substrate to which the module 80 is attached (described below), which has fringe capacitance and distributed inductance, and also radiates RF currents.

Figure 24:
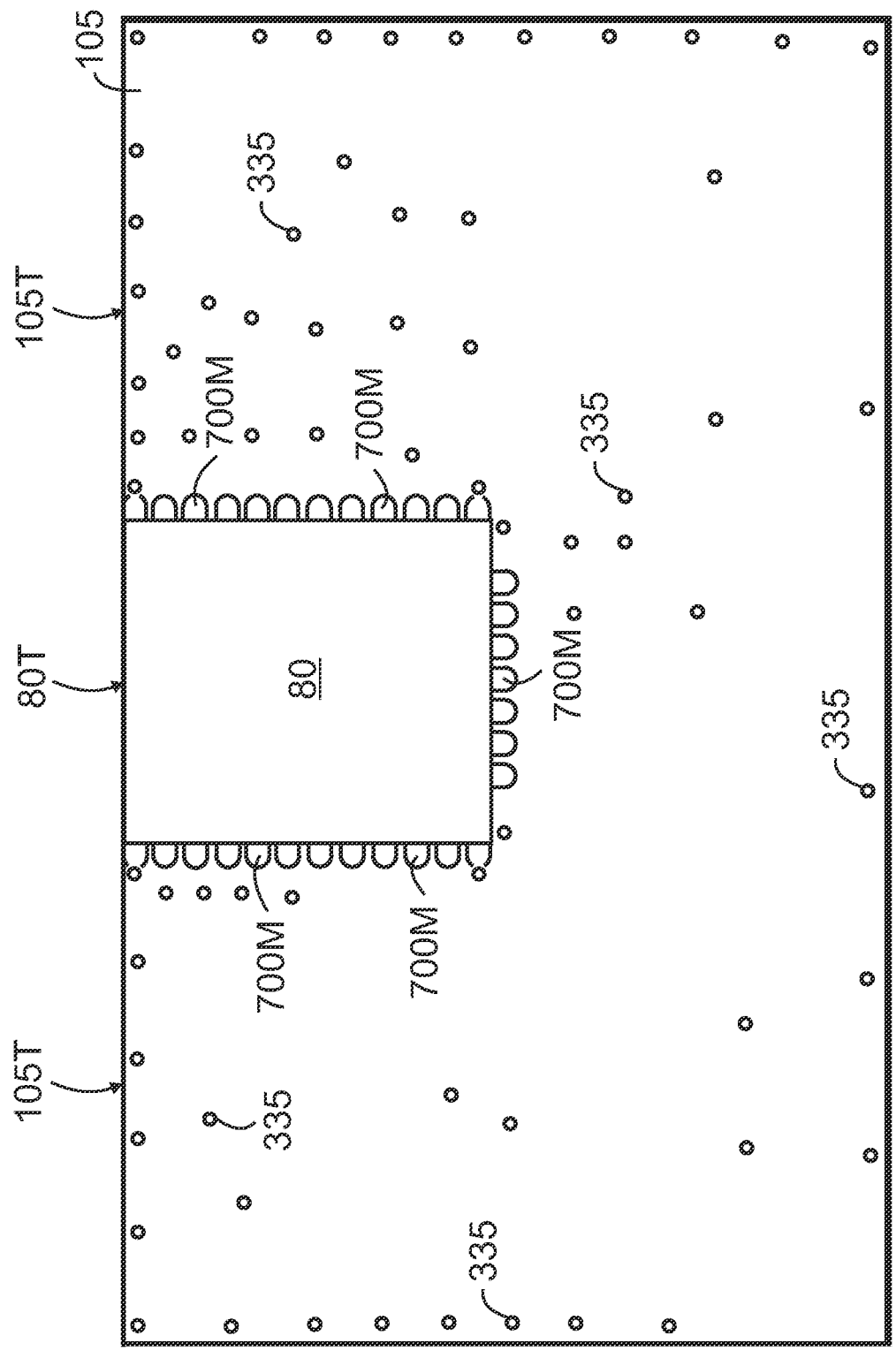
FIG. 24 shows a layout for an RF apparatus (or part of an RF apparatus) according to an exemplary embodiment.

As noted, in exemplary embodiments, the module 80 is attached (or coupled to, mounted to, or affixed) to a substrate 105. FIG. 24 shows this configuration according to an exemplary embodiment. As noted above, the top edge 80T of the module radiates some of the RF currents for the antenna structure. As also noted above, the top edge 105T of the substrate 105 radiates some of the RF currents for the antenna structure. Generally, in various embodiments, the antenna structure is tuned by the layout geometries of the various parts of the structure (e.g., the trace lengths and distances to the ground of the module conductive pattern 340M and/or the module conductive pattern 345M, the width and length of the module loop antenna 310M, the width of the substrate 105, i.e., the length of the top edge 105T of the substrate 105 (which includes the length of the top edge 80T of the module 80 in the configuration shown), and/or by the values of the elements or components in the LC network.

Note that a number of substrate ground vias 335 are used to couple the conductive surface (e.g., a conductive sheet or layer, such as a PCB layer) of the substrate 105 (i.e., the surface to which the module 80 is attached) to ground. As persons of ordinary skill in the art will understand, the conductive surface or layer of the substrate 105 may not be conductive across the entire surface of the substrate 105, for example, it might have conductive areas etched or removed (or not fabricated) where the module 80 makes electrical couplings (e.g., to power, other circuitry that operates in conjunction with the module 80, etc.) through the coupling mechanisms 700M.

In some embodiments, the top edge 105T of the substrate 105 is sized to have a length equal to (or nearly equal to in a practical, physical implementation that might also take into account parasitic elements) to half the wavelength of the RF signal (½λ). In such embodiments, the top edge 105T of the module 105 acts or behaves like a dipole antenna, and radiates RF energy similarly.

Figure 25:
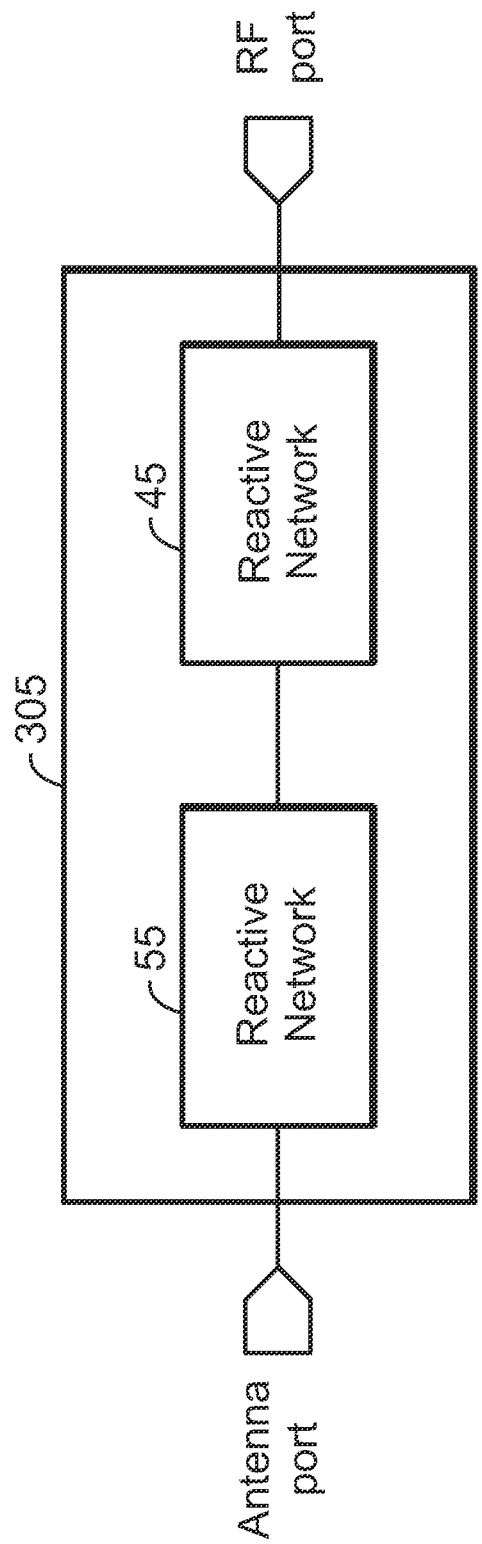
FIG. 25 shows a circuit arrangement for antenna matching circuitry according to another exemplary embodiment.

As noted above in connection with the layout shown in FIG. 23, the matching circuit includes a number of the module matching circuit components 305M, which in various embodiments include inductor(s) and capacitor(s). Thus, the module matching circuit components 305M generally denote such components, and FIG. 23 shows merely one example of a topography of a matching circuit. In various embodiments, a variety of topologies for the matching circuit and a variety of numbers and types of the module matching circuit components 305M may be used, depending on factors such as design and performance specifications, cost, available technology, etc., as persons of ordinary skill in the art will understand. FIG. 25 shows a general circuit arrangement for the antenna matching circuit 305 according to an exemplary embodiment.

More specifically, the matching circuit 305 in FIG. 25 includes the reactive network 45 coupled in series or cascade with the reactive network 55. The reactive networks 45 and 55, as the name suggests, include one or more inductors and/or capacitors, and are generally denoted the module matching circuit components 305M in FIG. 23. Referring again to FIG. 25, the matching circuit 305 includes an LC network, described below in more detail.

Figure 26:
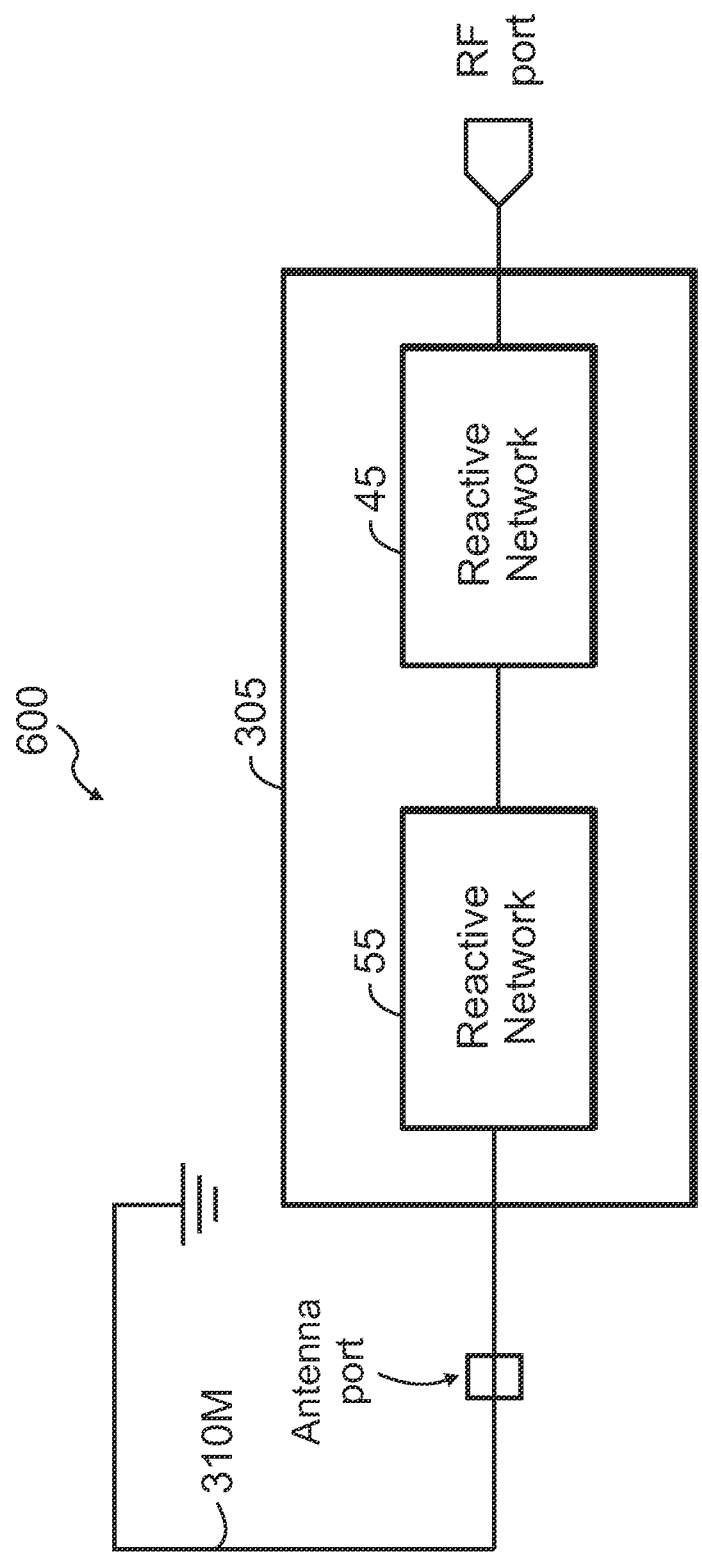
FIG. 26 shows a circuit arrangement for an RF apparatus (or part of an RF apparatus) according to an exemplary embodiment.

FIG. 26 shows a circuit arrangement for an RF apparatus (or part of an RF apparatus) 600 according to an exemplary embodiment. More specifically, the figure shows the electrical topology of the RF apparatus 600. The RF port couples to an RF circuit, as described above, and to the matching circuit 305. The matching circuit includes the reactive network 45 coupled in series or cascade with the reactive network 55, as described above. The reactive network 55 couples to the antenna port, i.e., couples to the module loop antenna 310M.

Figure 27:
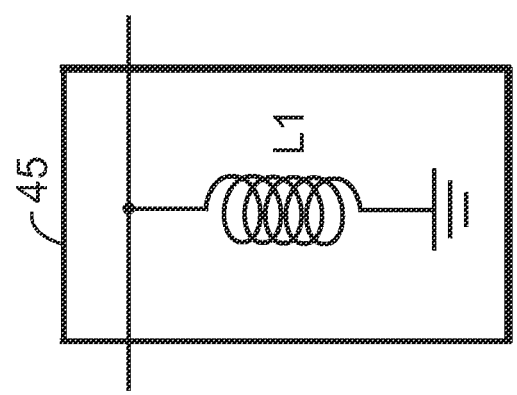
FIG. 27 shows a reactive network for an antenna matching circuitry according to an exemplary embodiment.
Figure 28:
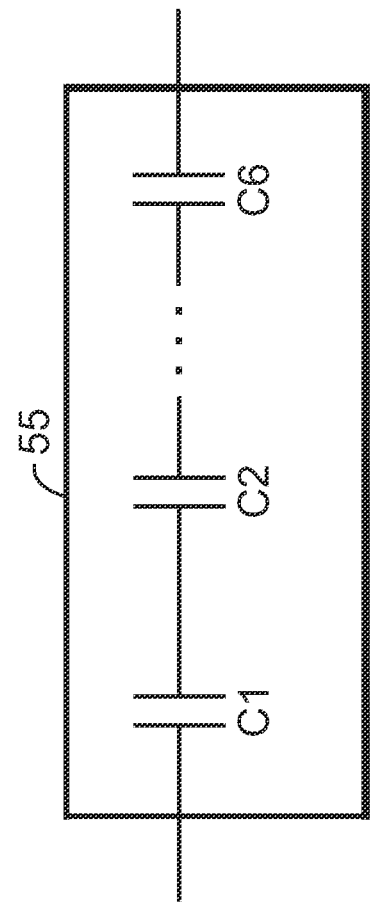
FIG. 28 shows a reactive network for an antenna matching circuitry according to an exemplary embodiment.

FIG. 27 shows the reactive network 45 according to an exemplary embodiment. In the exemplary embodiment shown, the reactive network 45 includes an inductor L1, coupled to ground in a shunt configuration. FIG. 28 shows a reactive network 55 according to an exemplary embodiment. In the exemplary embodiment shown, the reactive network 55 includes 6 capacitors, labeled C1-C6, coupled in a series or cascade configuration.

Figure 29:
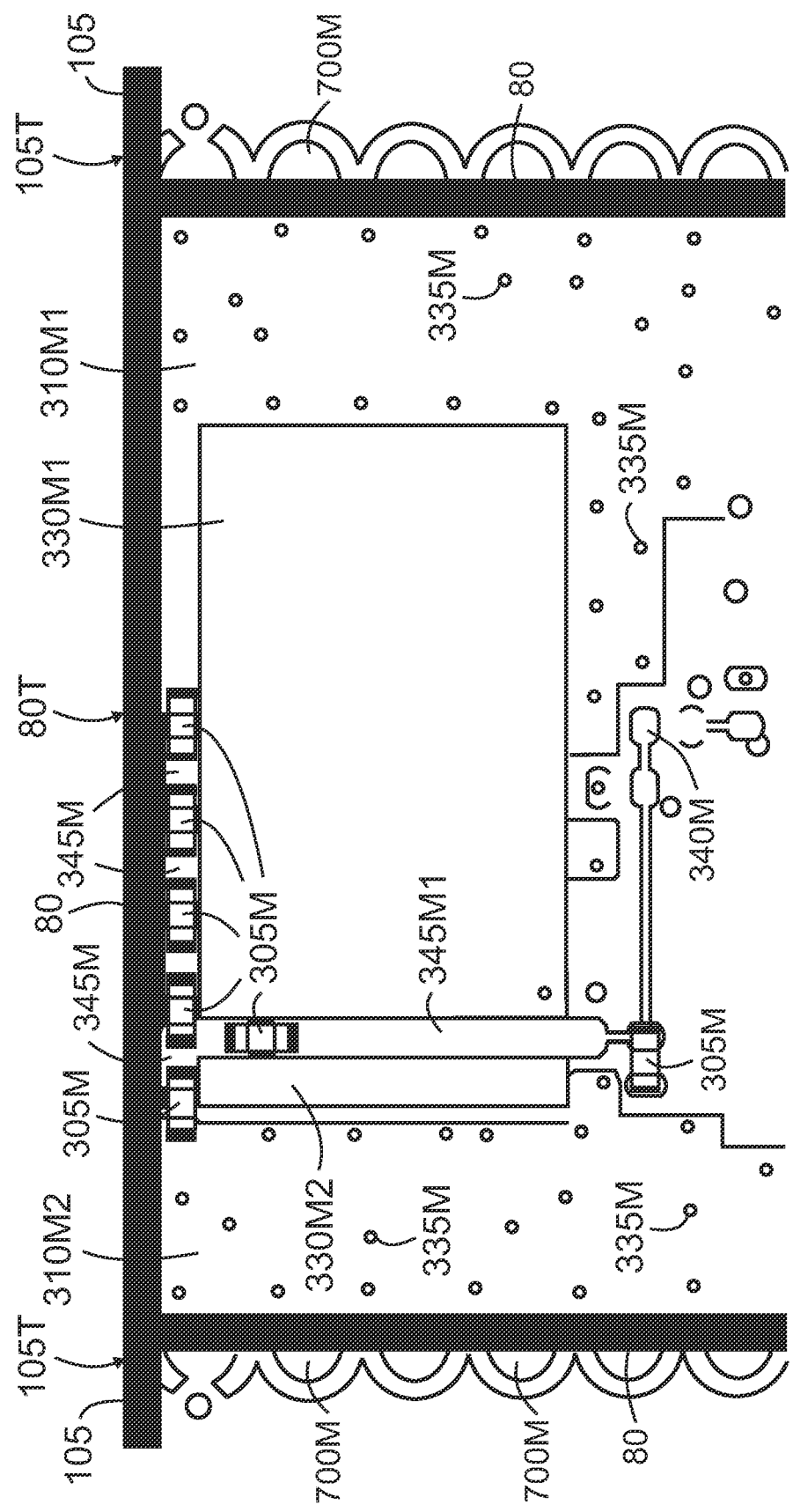
FIG. 29 shows a layout for a module according to an exemplary embodiment.

Another aspect of the disclosures relates to antenna structures that include dual loops. In various embodiments, the module loop antenna 310M is split into two sections or loops. FIG. 29 shows a partial layout for the module 80 according to an exemplary embodiment that uses this configuration. More specifically, the loop antenna is split into two loops, a smaller tuning loop denoted as the module loop antenna (or tuning loop) 310M2, and a larger loop denoted as the module loop antenna 310M1. The module tuning loop 310M2 can either behave as simple parallel tuning inductor in some embodiments, or with additional discrete elements in some embodiments, can create a second resonance to increase bandwidth. The configuration in FIG. 29 also includes two slots or voids, the module void (or slot) 330M1, which corresponds to the module loop antenna 310M1, and the module void (or slot) 330M2, which corresponds to the module tuning loop 310M2. The module 80 may be attached to the substrate 105, as described above. The module loop antenna 310M1, the module tuning loop 310M2, the module void 330M1, the module void 330M2, the module ground vias 335M, the module conductive pattern 340M, and the module conductive pattern 345M1 may be fabricated similarly to the corresponding features described above (e.g., in connection with FIG. 23).

Referring again to FIG. 29, the RF circuit (whether transmitting or receiving; not shown) couples to the module conductive trace or pattern 340M, as described above. The module conductive pattern 345M couples the module conductive pattern 340M to the module loop antenna 310M1 and to the module tuning loop 310M2 via the module matching circuit components 305M.

As noted above, in exemplary embodiments, the module 80 is attached to the substrate 105. Referring to FIG. 29, the top edge 80T of the module radiates some of the RF currents for the antenna structure. The top edge 105T of the substrate 105 radiates some of the RF currents for the antenna structure. The RF currents flow at the edges of the module loop antenna 310M1, the edges of the module tuning loop 310M2, and also at the surfaces of the module conductive pattern 340M and the module conductive pattern 345M. Note that the frinding fields of the module conductive pattern 340M and the module conductive pattern 345M tend to concentrate to the GND plane beneath the module 80, so the radiation from the conductive patterns is relatively limited compared to the radiation from the loops. A larger part of the RF radiation is generated by the flow of the RF currents at the edges of the module loop antenna 310M1, the edges of the module tuning loop 310M2 (the top edge 105T of the substrate 105 also radiates RF energy, as described above).

Generally, in various embodiments, the antenna structure is tuned by the layout geometries of the various parts of the structure (e.g., the trace lengths and distances to the ground of the module conductive pattern 340M and/or the module conductive pattern 345M, the width and length of the module loop antenna 310M1, the width and length of the module tuning loop 310M2, the width of the substrate 105, i.e., the length of the top edge 105T of the substrate 105 (which includes the length of the top edge 80T of the module 80 in the configuration shown), and/or by the values of the elements or components in the LC network.

Figure 30:
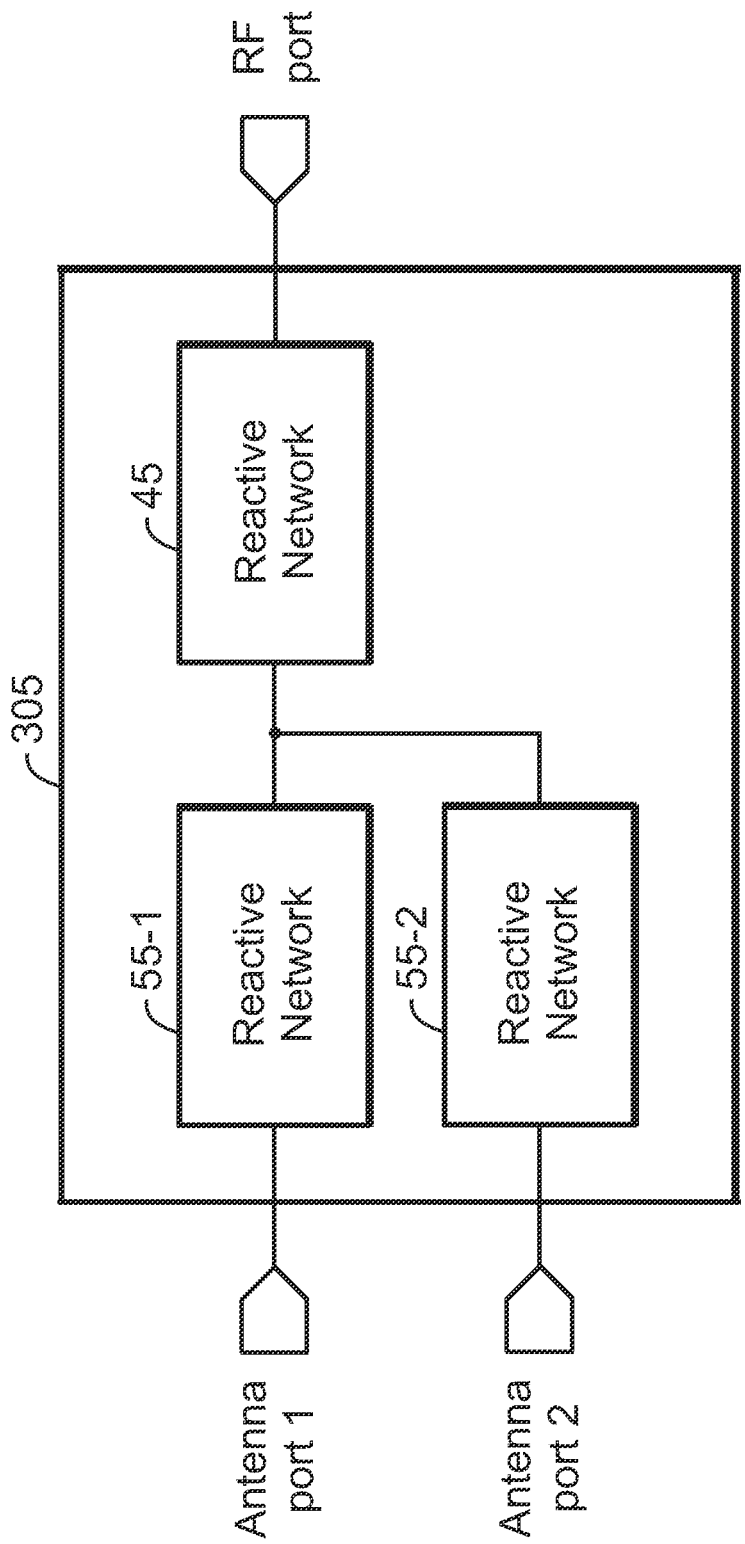
FIG. 30 shows a circuit arrangement for antenna matching circuitry according to another exemplary embodiment.

Similar to the embodiment shown in FIG. 23, the matching circuit in the embodiment of FIG. 29 includes a number of the module matching circuit components 305M, which in various embodiments include inductor(s) and capacitor(s). Thus, the module matching circuit components 305M generally denote such components, and FIG. 29 shows merely one example of a topography of a matching circuit. In various embodiments, a variety of topologies for the matching circuit and a variety of numbers and types of the module matching circuit components 305M may be used, depending on factors such as design and performance specifications, cost, available technology, etc., as persons of ordinary skill in the art will understand. FIG. 30 shows a general circuit arrangement for the antenna matching circuit 305 according to an exemplary embodiment.

More specifically, the matching circuit 305 in FIG. 30 includes the reactive network 45 coupled in series or cascade with the reactive network 55-1. The matching circuit 305 further includes the reactive network 55-2, coupled to the reactive network 45 and to the reactive network 55-1. The reactive networks 45, 55-1, and 55-2, as the name suggests, include one or more inductors and/or capacitors, and are generally denoted the module matching circuit components 305M in FIG. 29. Referring again to FIG. 30, the matching circuit 305 includes an LC network, described below in more detail.

Figure 31:
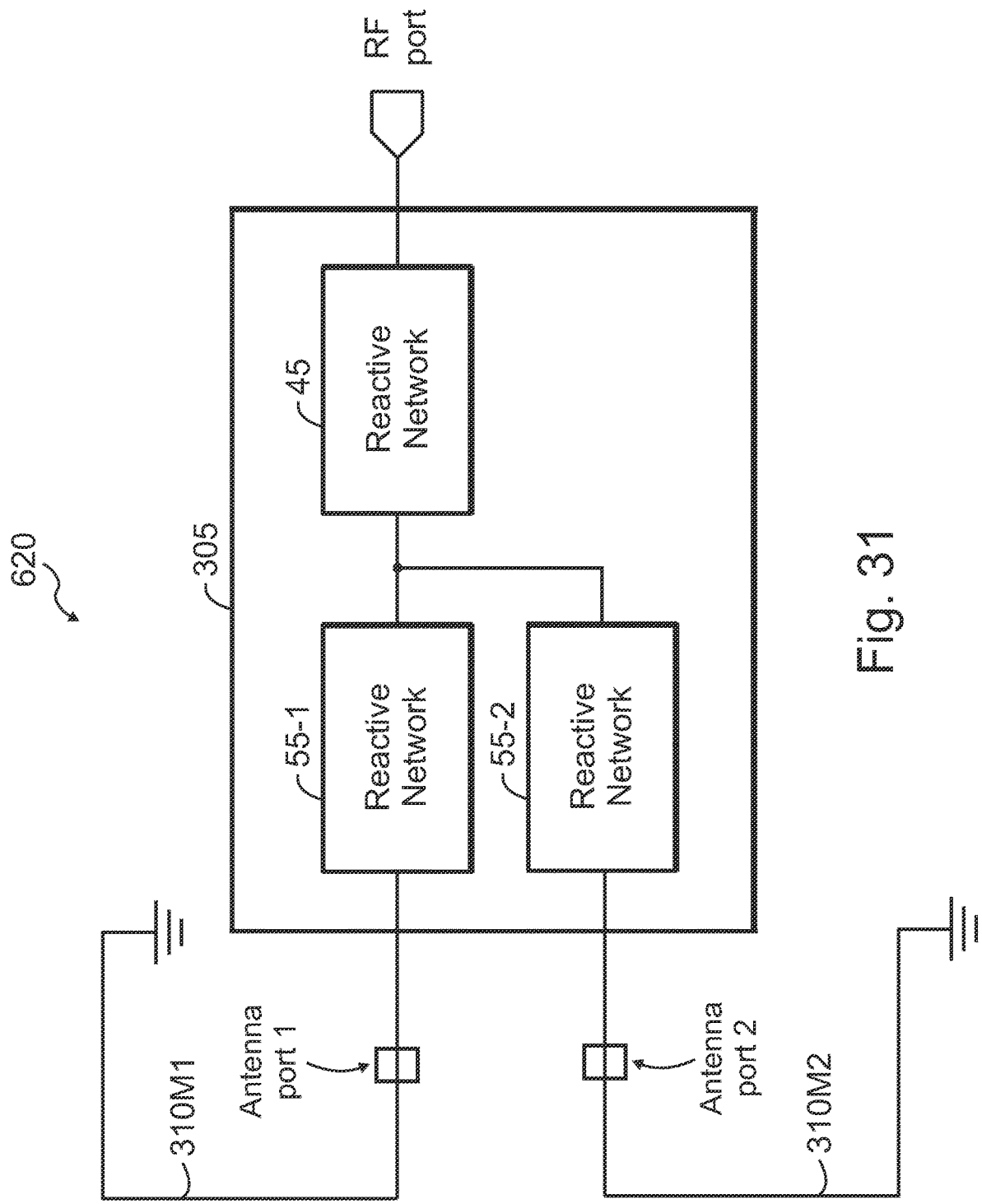
FIG. 31 shows a circuit arrangement for an RF apparatus (or part of an RF apparatus) according to an exemplary embodiment.

FIG. 31 shows a circuit arrangement for an RF apparatus (or part of an RF apparatus) 620 according to an exemplary embodiment. More specifically, the figure shows the electrical topology of the RF apparatus 620. The RF port couples to an RF circuit, as described above, and to the matching circuit 305. The matching circuit includes the reactive network 45 coupled to the reactive network 55-1 and to the reactive network 55-2, as described above. The reactive network 55-1 couples to the antenna port 1, i.e., couples to the module loop antenna 310M1. The reactive network 55-2 couples to the antenna (or tuning) port 2, i.e., couples to the module tuning 310M2.

Figure 33:
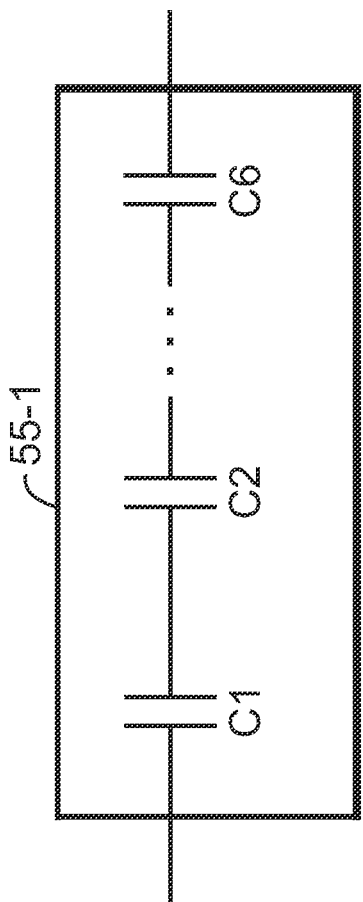
FIG. 33 shows a reactive network for an antenna matching circuitry according to an exemplary embodiment.
Figure 34:
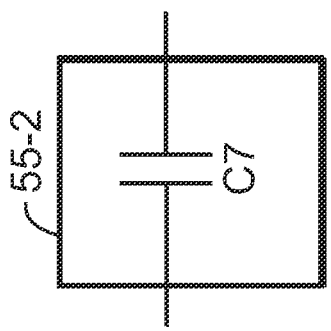
FIG. 34 shows a reactive network for an antenna matching circuitry according to an exemplary embodiment.
Figure 32:
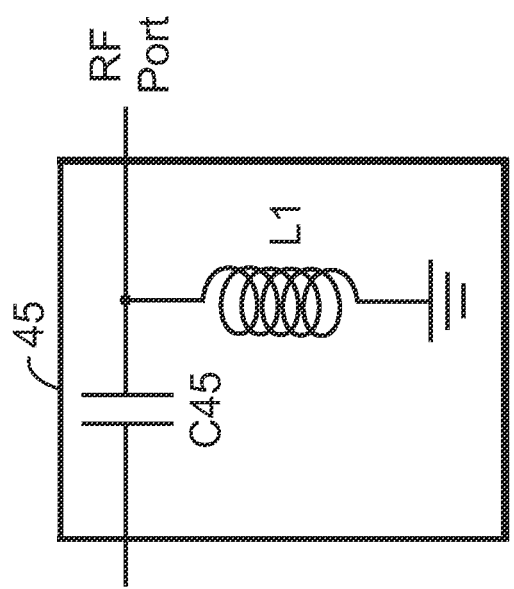
FIG. 32 shows a reactive network for an antenna matching circuitry according to an exemplary embodiment.

FIG. 32 shows the reactive network 45 according to an exemplary embodiment. In the exemplary embodiment shown, the reactive network 45 includes an inductor L1, coupled to ground in a shunt configuration, and a capacitor C45 that couples the RF port to the output of the reactive network 45. FIG. 33 shows a reactive network 55-1 according to an exemplary embodiment. In the exemplary embodiment shown, the reactive network 55-1 includes 6 capacitors, labeled C1-C6, coupled in a series or cascade configuration. FIG. 34 shows a reactive network 55-2 according to an exemplary embodiment. In the exemplary embodiment shown, the reactive network 55-2 includes a capacitor C7 that couples together the respective ports of the reactive network 55-2.

Another aspect of the disclosure relates to antennas or antenna structures that include combined monopole, loop, and LC (inductive-capacitive) resonant networks. As described below in detail, in exemplary embodiments, a printed antenna trace, a double slotted printed loop, and LC resonant networks (LCRN) are combined to realize an antenna (interchangeably referred to as antenna structure). Such antenna structures may be used with RF receivers, RF transmitters, and/or RF transceivers, as desired.

Antennas according to exemplary embodiments provide several characteristics. First, antennas according to exemplary embodiments do not use a DC blocking component, such as a capacitor. As a result, the feed mechanism for the antennas becomes simpler and cheaper, with fewer components.

Second, compared to some antennas, such as those using chip antennas, antennas according to exemplary embodiments have lower cost (e.g., 7 cents vs. 2 cents). Third, as described below in detail, antennas according to exemplary embodiments use a printed trace (e.g., a trace on a PCB, substrate, etc.) as a monopole antenna (printed monopole antenna). Fourth, as described below in detail, antennas according to exemplary embodiments use LCRN (e.g., using discrete components, such as inductor(s) and capacitor(s)) to excite and resonate the printed monopole antenna, and slotted inductive loops formed by the clearance area or voids (the LCRN components are situated along traces that form part of the antenna).

Fifth, antennas according to exemplary embodiments operate well in apparatus that conform to various RF or communication protocols, such as Bluetooth and Zigbee. Sixth, antennas according to exemplary embodiments can work in applications where original antenna clearance loop sizes substrate layouts are pre-existing, i.e., are backwards compatible. Seventh, antennas according to exemplary embodiments are relatively flexible (e.g., compared to conventional antennas), allowing higher degrees of freedom during the design phase, improved tenability, and are relatively easy to optimize for different applications.

Eighth, by virtue of not using chip or ceramic antennas, antennas according to exemplary embodiments avoid dependence on particular vendors, and use readily available components to form the LCRN. Ninth, in exemplary embodiments, applying the printed trace and the double slotted loop together with the LCRN results in nearly the same or even better performance (bandwidth, radiation efficiency, gain, etc.), than using chip antennas, but with lower price, as noted above.

Figure 35:
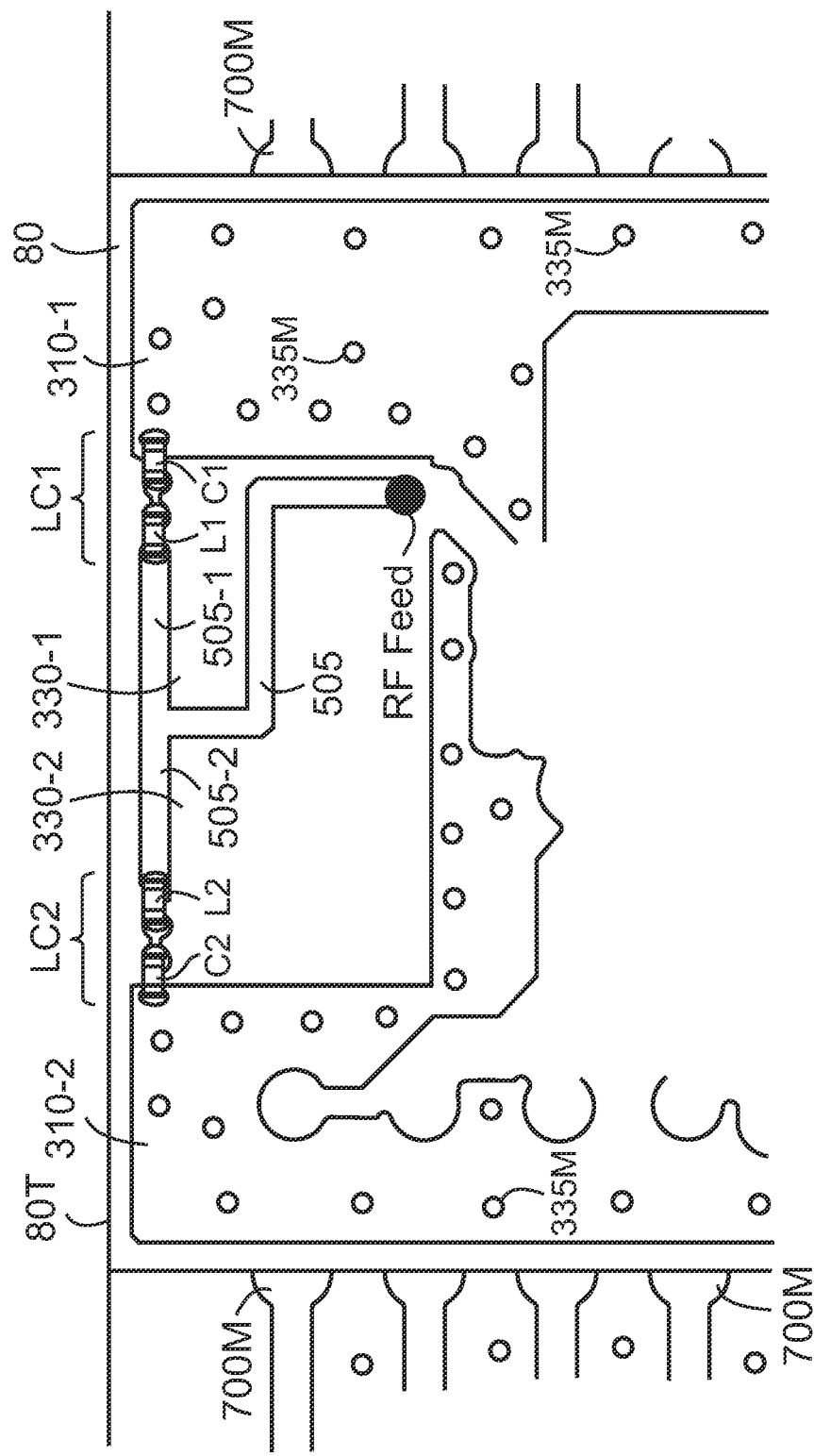
FIGS. 35-36 show antenna structures according to exemplary embodiments.

FIG. 35 shows an antenna or antenna structure according to an exemplary embodiment. More specifically, as noted, the antenna includes a printed monopole-type antenna (a trace or printed trace that constitutes or functions or acts as a monopole antenna), a printed double slotted loop, and an LCRN.

Similar to the modules described above, the module 80 has a top side, labeled 80T. Along or near the top side of the module 80 are situated traces 505-1 and 505-2, and two LCRNs labeled LC1 and LC2, respectively. One end or side or terminal of LC1 is coupled to the trace 505-1. Similarly, one end or side or terminal of LC2 is coupled to the trace 505-2.

One end of side or terminal of LC1 is coupled to ground via the loop or loop trace 310-1 and the module ground vias 335M. Note that the loop trace 310-1 constitutes part of the double slotted loop that forms part of the overall antenna structure.

Similarly, one end of side or terminal of LC2 is coupled to ground via the loop trace 310-2 and the module ground vias 335M. Note that the loop trace 310-2 constitutes part of the double slotted loop that forms part of the overall antenna structure. Using or including the LCRNs LC1 and LC2 improves the tuneability of the antenna structure in terms of impedance and center frequency.

The traces 505-1 and 505-2 are coupled together and also to the trace 505. The RF feed (e.g., from a transmitter (not shown)) provides RF energy to the trace 505. Note the absence of a DC blocking component in the RF feed path. The trace 505, either alone or in combination with one or both of the traces 505-1 and 505-2 constitutes or functions as a monopole antenna.

The RF energy conducted by the trace 505 and the trace 505-1 flows through the LCRN LC1 and the loop trace 310-1 to ground, as noted above. Similarly, the RF energy conducted by the trace 505 and the trace 505-2 flows through the LCRN LC2 and the loop trace 310-2 to ground, as noted above.

The double slotted loop is formed by the traces 505, 505-1, 505-2 and the loop traces 310-1 and 310-2. The voids or clearance areas (i.e., areas where electrical conducting material has been removed or has not been deposited or formed) 330-1 and 330-2 constitute the slots for the overall antenna or antenna structure. As such, the antenna or antenna structure has a double slotted loop.

The impedance of the antenna structure is matched to the impedance of the RF circuit (not shown) coupled to the RF feed by the LCRNs LC1 and LC2. As persons of ordinary skill in the art will understand, component values and types for the components in LC1 and LC2 may be chosen so as to provide the impedance matching functionality.

Furthermore, the antenna or antenna structure is tuned by the LCRNs LC1 and LC2, and by the layout geometries (trace lengths and distances to the ground, the width and length of loop traces, and dimensions of a substrate to which the module 80 may be affixed or attached (see FIG. 37)). As persons of ordinary skill in the art will understand, component values and types for the components in LC1 and LC2 may be chosen so as to tune the center frequency of the overall antenna or antenna structure (by also or instead changing the other factors mentioned, such as trace lengths and distances to the ground, the width and length of loop traces, and dimensions of a substrate to which the module 80 may be affixed or attached).

The radiation of RF energy is provided in part by the traces 505 (alone or in combination with one or both of the traces 505-1 and 505-2) in a monopole antenna fashion (i.e., providing the functionality of a monopole antenna). The radiation of the RF energy is also provided in part by the double slotted loop and also by the edge of a substrate to which the module 80 is affixed (see FIG. 37).

The RF current distribution for the antenna structure concentrates at the edges of the trace(s) for the monopole antenna, the edges of the loop traces, and also at the surface of the RF feed line. The RF currents in the trace(s) for the monopole antenna in the loop traces generate RF radiation, as noted above.

In the exemplary embodiment shown in FIG. 35, the LCRN LC1 includes an inductor L1 coupled to a capacitor C1. Similarly, the LCRN LC2 includes an inductor L2 coupled to a capacitor C2. Other configurations or topologies for the LCRNs LC1 and LC2 are possible and contemplated.

Figure 36:
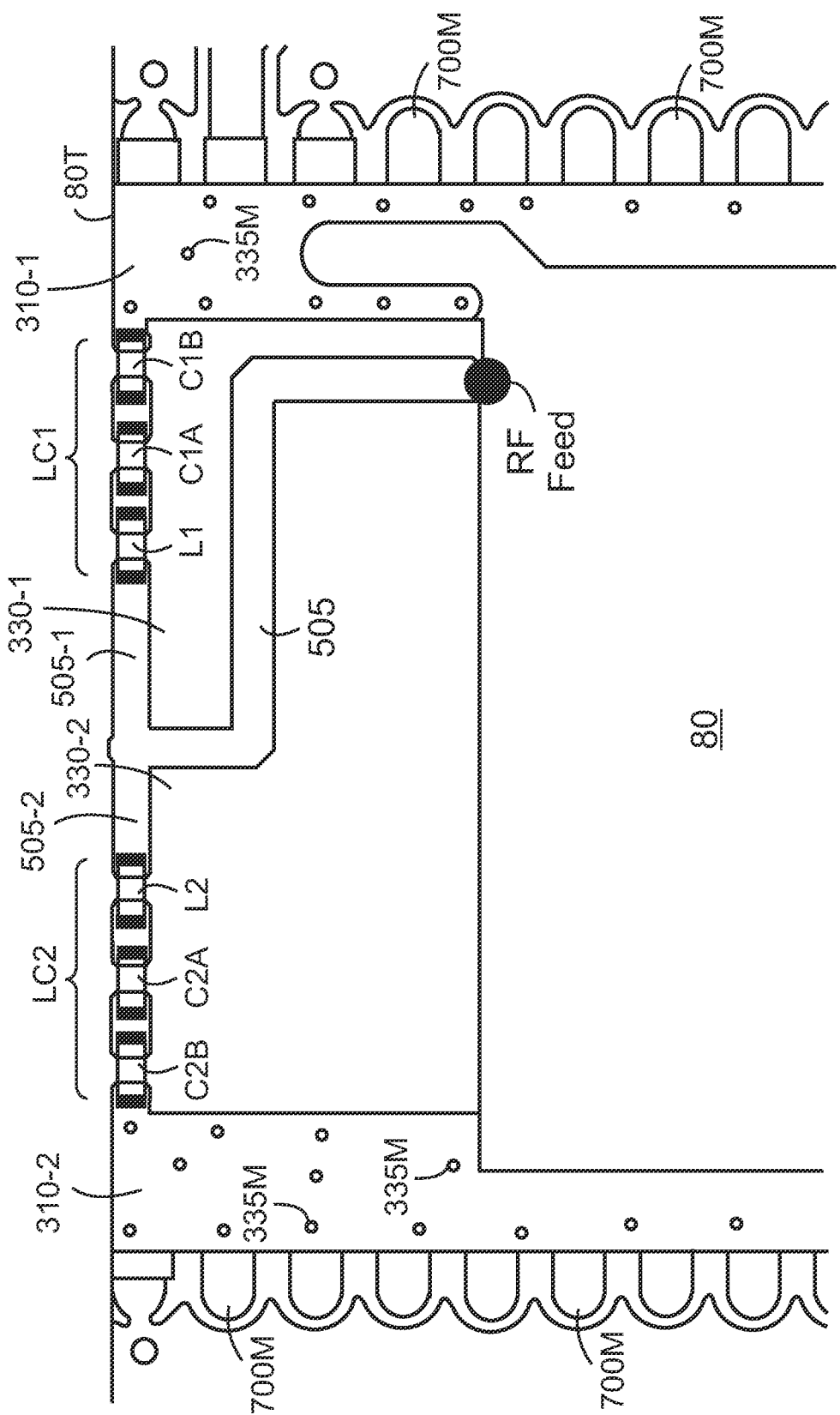

For example, FIG. 36 shows an antenna structure in which the LCRN LC1 uses an inductor L1 coupled to capacitors C1A and C1B. Similarly, the LCRN LC2 uses an inductor L2 coupled to capacitors C2A and C2B. Using multiple capacitors increases component count, but allows reducing "technological spread" or the sensitivity of the characteristics of the LCRNs (e.g., resonant frequency, bandwidth, etc.) to component tolerances.

For example, assume that one seeks to use a 1 nF capacitor in LC1, using capacitors that have a 10% tolerance. If one uses a single 1 nF capacitor, then the capacitance in LC1 has a 10% tolerance, i.e., its value can vary from 0.9 nF to 1.1 nF. Now suppose that one uses two 2 nF capacitors in series (e.g., C1A=2 nF and C1B=2 nF). The series combination of the capacitors C1B and C1B produces an overall capacitance of 1 nF. But using the same tolerance value of 10%, the values of the capacitors C1A and C1B can vary between 1.8 nF to 2.2 nF. Assuming that because of tolerance the capacitors have the values C1A=1.8 nF and C1B=2.2 nF, the overall capacitance is 0.99 nF. Compared to using a single capacitor with 10% tolerance, using two larger-value capacitors with the same 10% tolerance reduces the tolerance of the overall capacitance in LC1.

Generally stated, by using multiple capacitors in series the value of each individual capacitor can be made larger, and thus the tolerance has a smaller impact on the overall capacitance. A similar scheme may be applied to LCRN LC2. As shown, LC2 has a capacitor C2A coupled in series to a capacitor C2B. Note that the same concept may be applied by using more than two capacitors, and may also be applied to inductors, as described below. Note that similar to FIG. 35, using or including the LCRNs LC1 and LC2 improves the tuneability of the antenna structure in terms of impedance and center frequency.

Figure 37:
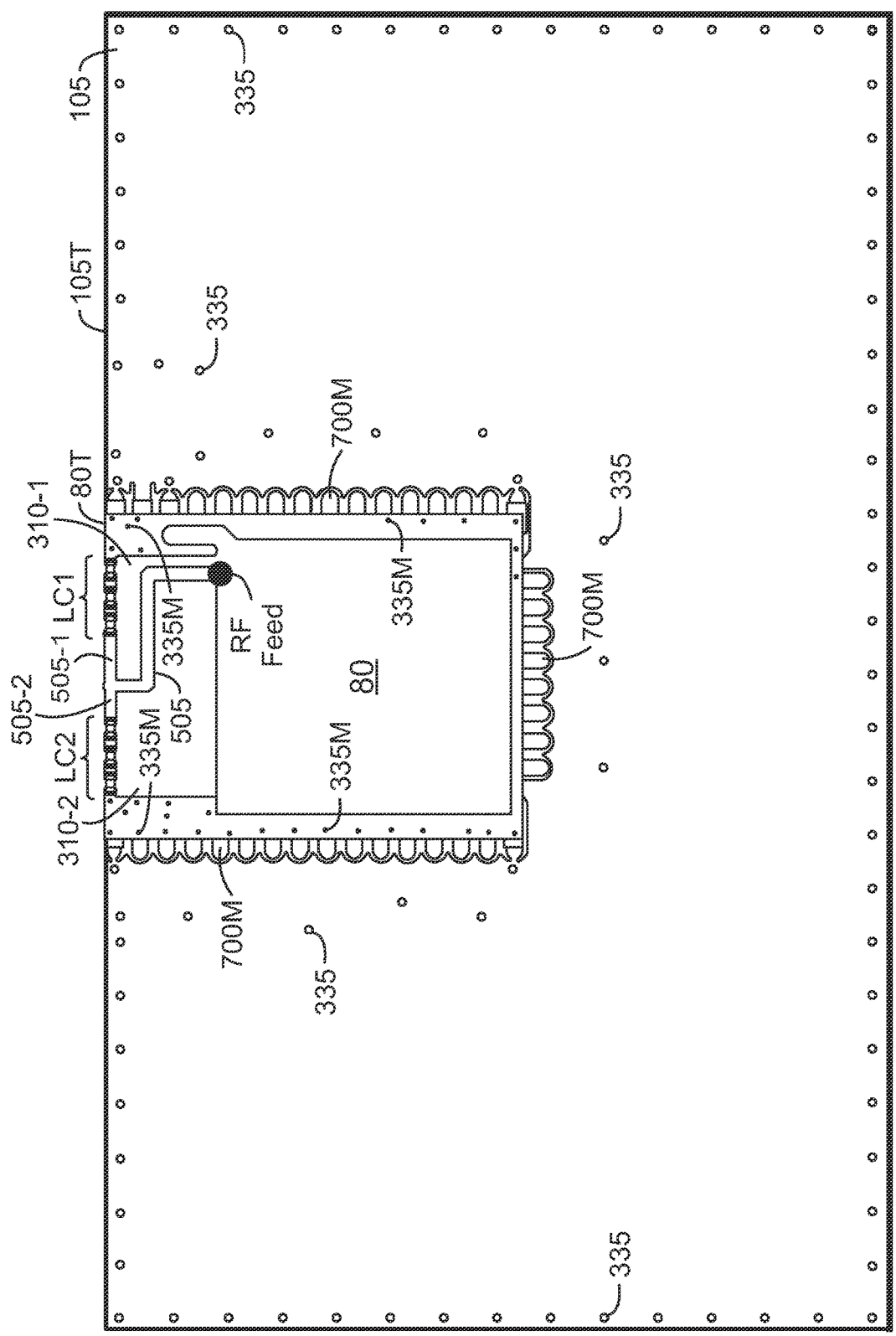
FIG. 37 shows a module containing an antenna structure mounted to a substrate according to an exemplary embodiment.

As noted above, the module 80 may be mounted to a substrate. FIG. 37 shows an exemplary embodiment in which the module 80 is mounted or affixed to the substrate 105. In the embodiment shown, the top edge 80T of the module 80 is aligned (or is nearly aligned) with the top edge 105T of the substrate 105. As also noted above, the edge of the substrate 105 (in this case the top edge 105T) also generates RF radiation. Although the top edge 105T generates less per-unit radiation than the antenna structures described above, because of the relatively large dimensions of the top edge 105T to the dimensions of the various parts of the antenna structure, the RF radiation by the top edge 105T can be substantial or relatively large.

Figure 38:
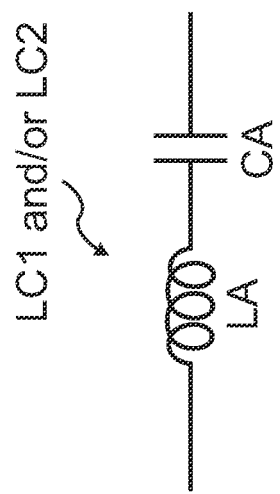
FIGS. 38-41 show inductive-capacitive (LC) networks according to exemplary embodiments.

As noted above, a variety of configurations or topologies for the LCRNs LC1 and LC2 are possible and contemplated. FIGS. 38-41 illustrate some examples. Referring to FIG. 38, it shows the LCRN used in the antenna structure in FIG. 35, described above. To reiterate, the LCRN, which may be used to realize LC1 and/or LC2, includes an inductor LA coupled to a capacitor CA.

Figure 39:
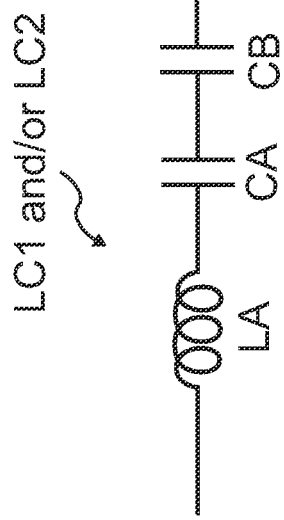

FIG. 39 shows the LCRN used in the antenna structure in FIG. 36, described above. To reiterate, the LCRN, which may be used to realize LC1 and/or LC2, includes an inductor LA coupled to a pair of capacitors CA and CB. Using more than a single capacitor provides the characteristics described above (e.g., less sensitivity to component tolerances).

Figure 40:
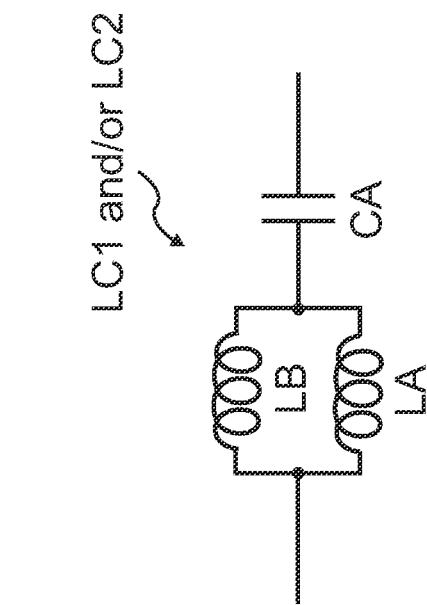

FIG. 40 shows an LCRN that rather than using multiple capacitors uses multiple inductors to reduce sensitivity to component tolerances. More specifically, the LCRN, which may be used to realize LC1 and/or LC2, includes a capacitor CA coupled in a series to two inductors coupled in parallel, i.e., LA and LB, respectively.

Figure 41:
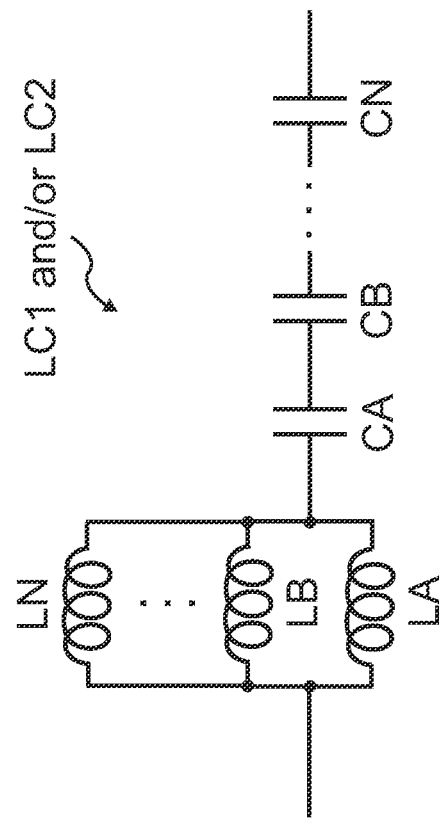

FIG. 41 shows a generalized LCRN for use in antenna structures according to exemplary embodiments. The LCRN, which may be used to realize LC1 and/or LC2, includes N inductors (where N is a positive integer), labeled LA through LN, coupled in parallel. The paralleled inductors LA-LN are coupled to N capacitors, labeled CA through CN, coupled in series.

In the example shown, the number of inductors equals the number of capacitors. As persons of ordinary skill in the art will understand, however, in other exemplary embodiments, one may use N inductors and M capacitors, where M is a positive integer that may or may not equal N. In the example shown, use of multiple inductors and multiple capacitors reduces sensitivity to component tolerances, as described above.

Note that LCRNs shown in FIGS. 38-41 are merely illustrative examples. Other arrangements (e.g., different numbers of inductors in FIGS. 38 and 39) may be used, as desired, and as persons of ordinary skill in the art will understand. Furthermore, the LC1 and LC2 may use different topologies or configurations of LCRN, as desired. For example, in one embodiment, multiple inductors and a single capacitor may be used in LC1 versus multiple capacitors and a single inductor in LC2, vice-versa, etc.

In exemplary embodiments, the components in LC1 and LC2 are lumped elements. For example, in some embodiments, discrete SMD devices (e.g., surface mount inductors, surface mount capacitors) may be used, as desired. Depending on geometry, dimensions, frequency of operation, etc., distributed components may also be used in some applications.

Figure 42:
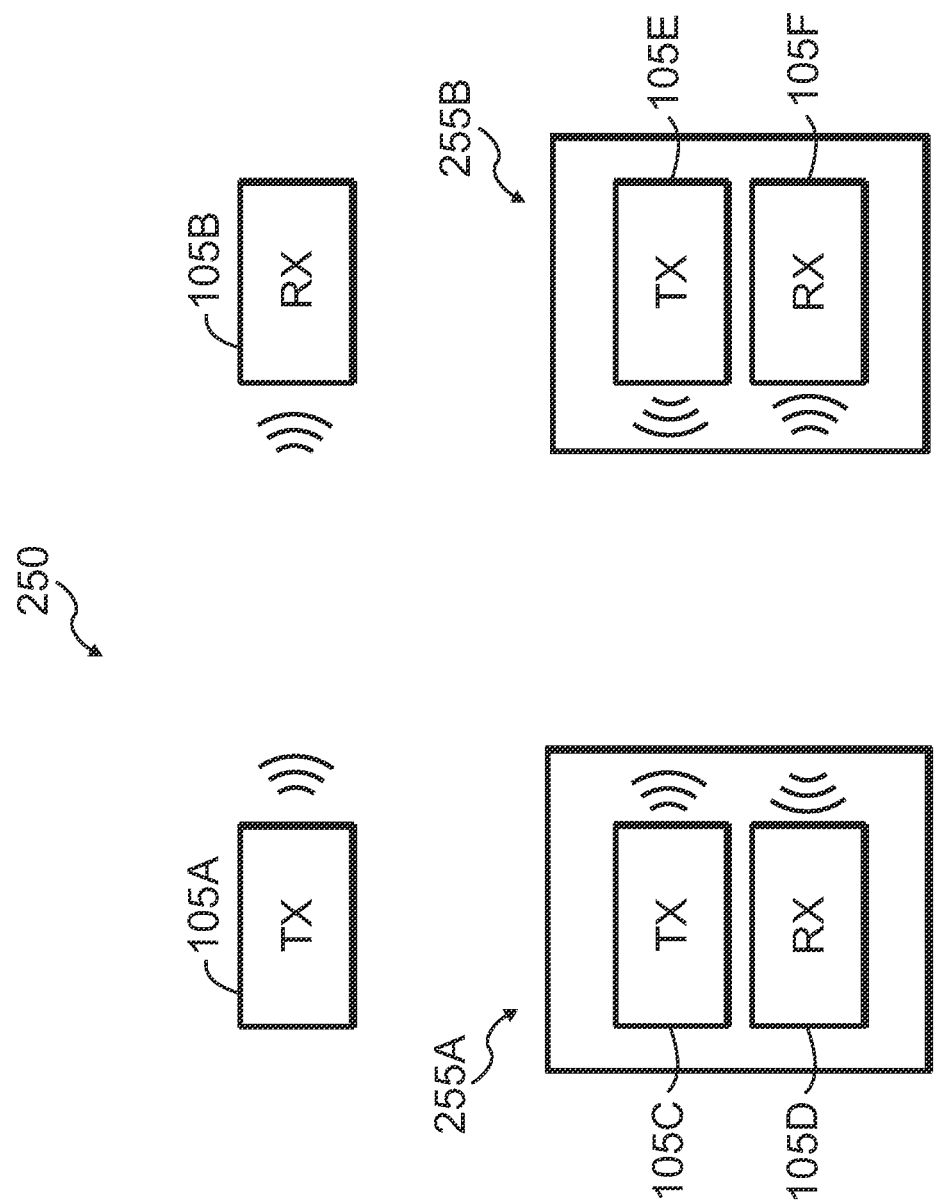
FIG. 42 shows a system for radio communication according to an exemplary embodiment.

Antenna structures according to exemplary embodiments may be used in a variety of communication arrangements, systems, sub-systems, networks, etc., as desired. FIG. 42 shows a system 250 for radio communication according to an exemplary embodiment.

System 250 includes a transmitter 105A, which includes antenna structure 15 (not shown). Via antenna structure 15 or loop antenna 310, transmitter 105A transmits RF signals. The RF signals may be received by receiver 105B, which includes antenna structure 15 (not shown) or loop antenna 310 (not shown). In addition, or alternatively, transceiver 255A and/or transceiver 255B might receive the transmitted RF signals via receiver 105D and receiver 105F, respectively. One or more of receiver 105D and receiver 105F includes antenna structure 15 (not shown) or loop antenna 310 (not shown).

In addition to receive capability, transceiver 255A and transceiver 255B can also transmit RF signals. More specifically, transmitter 105C and/or transmitter 105E in transceiver 255A and transceiver 255B, respectively, may transmit RF signals. The transmitted RF signals might be received by receiver 105B (the stand-alone receiver), or via the receiver circuitry of the non-transmitting transceiver. One or more of transmitter 105C and transmitter 105E includes antenna structure 15 (not shown) or loop antenna 310 (not shown).

Other systems or sub-systems with varying configuration and/or capabilities are also contemplated. For example, in some exemplary embodiments, two or more transceivers (e.g., transceiver 255A and transceiver 255B) might form a network, such as an ad-hoc network. As another example, in some exemplary embodiments, transceiver 255A and transceiver 255B might form part of a network, for example, in conjunction with transmitter 105A.

In exemplary embodiments, RF apparatus including antenna structure 15 may include a variety of RF circuitry 35. For example, in some embodiments, direct conversion receiver and/or transmitter circuitry may be used. As another example, in some embodiments, low intermediate frequency (IF) receiver and offset phase locked loop (PLL) transmitter circuitry may be used.

In other embodiments, other types of RF receiver and/or transmitter may be used, as desired. The choice of circuitry for a given implementation depends on a variety of factors, as persons of ordinary skill in the art will understand. Such factors include design specifications, performance specifications, cost, IC, die, module, or device area, available technology, such as semiconductor fabrication technology), target markets, target end-users, etc.

In exemplary embodiments, RF apparatus including antenna structure 15 or loop antenna 310 may communicate according to or support a variety of RF communication protocols or standards. For example, in some embodiments, RF communication according to Wi-Fi protocols or standards may be used or supported. As another example, in some embodiments, RF communication according to Bluetooth protocols or standards may be used or supported. As another example, in some embodiments, RF communication according to ZigBee protocols or standards may be used or supported. Other protocols or standards are contemplated and may be used or supported in other embodiments, as desired.

In other embodiments, other types of RF communication according to other protocols or standards may be used or supported, as desired. The choice of protocol or standard for a given implementation depends on a variety of factors, as persons of ordinary skill in the art will understand. Such factors include design specifications, performance specifications, cost, complexity, features (security, throughput), industry support or availability, target markets, target end-users, target devices (e.g., IoT devices), etc.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. An apparatus, comprising:
 a module comprising an antenna structure, the antenna structure comprising:
  a printed monopole antenna;
  first and second inductive-capacitive (LC) resonant networks coupled to the printed monopole antenna; and
  a double slotted loop coupled to the first and second LC resonant networks.

2. The apparatus according to claim 1, wherein at least one of the first and second LC resonant networks comprises an inductor coupled to a capacitor.

3. The apparatus according to claim 1, wherein at least one of the first and second LC resonant networks comprises an inductor coupled to a plurality of capacitors.

4. The apparatus according to claim 3, wherein the plurality of capacitors are coupled in series.

5. The apparatus according to claim 1, at least one of the first and second LC resonant networks comprises a capacitor coupled to a plurality of inductors.

6. The apparatus according to claim 5, wherein the plurality of inductors are coupled in parallel.

7. The apparatus according to claim 1, further comprising a radio frequency (RF) circuit coupled to the printed monopole antenna, wherein component values in the first and second LC resonant networks are selected to match an impedance of the RF circuit to an impedance of the antenna structure.

8. The apparatus according to claim 1, wherein component values in the first and second LC resonant networks are selected to tune a center frequency of the antenna structure.

9. The apparatus according to claim 1, wherein the double slotted loop comprises first and second traces coupled to ground and to the first and second LC resonant networks, respectively.

10. An apparatus, comprising:
a module comprising:
an antenna structure comprising:
a monopole antenna comprising a printed trace in the module;
a first inductive-capacitive (LC) resonant network coupled to the monopole antenna, the first inductive-capacitive (LC) resonant network comprising a first inductor coupled to a first plurality capacitors;
a second LC resonant network coupled to the monopole antenna, the second LC resonant network comprising a second inductor coupled to a second plurality capacitors; and
a double slotted printed loop coupled to the first and second LC resonant networks.

11. The apparatus according to claim 10, wherein capacitors in the first plurality of capacitors are coupled in series, and wherein capacitors in the second plurality of capacitors are coupled in series.

12. The apparatus according to claim 10, wherein the module is mounted to a substrate, and wherein an edge of the substrate radiates RF energy provided to the antenna structure.

13. The apparatus according to claim 10, further comprising a radio frequency (RF) circuit coupled to the monopole antenna, wherein values of the first and second inductors and values of the first and second pluralities of capacitors are selected to match an impedance of the RF circuit to an impedance of the antenna structure.

14. The apparatus according to claim 10, wherein values of the first and second inductors and values of the first and second pluralities of capacitors are selected to tune a center frequency of the antenna structure.

15. A method of providing an antenna structure in a radio frequency (RF) module, the method comprising:
fabricating a monopole antenna by using a printed trace of the RF module;
fabricating first and second inductive-capacitive (LC) resonant networks, wherein the first and second LC resonant networks are coupled to the monopole antenna; and
fabricating a double slotted loop, wherein the double slotted loop is coupled to the first and second LC resonant networks.

16. The method according to claim 15, wherein fabricating the first and second LC resonant networks comprises including in at least one of the first and second LC resonant networks an inductor coupled to a capacitor.

17. The method according to claim 15, wherein fabricating the first and second LC resonant networks comprises including in at least one of the first and second LC resonant networks an inductor coupled to a plurality of capacitors.

18. The method according to claim 17, wherein capacitors in the plurality of capacitors are coupled in series.

19. The method according to claim 15, wherein fabricating the first and second LC resonant networks comprises selecting component values of the first and second LC resonant networks to match an impedance of an RF circuit in the RF module to an impedance of the antenna structure.

20. The method according to claim 15, wherein fabricating the first and second LC resonant networks comprises selecting component values of the first and second LC resonant networks to tune a center frequency of the antenna structure.

* * * * *